United States Patent
Javey et al.

(10) Patent No.: US 8,525,228 B2
(45) Date of Patent: Sep. 3, 2013

(54) SEMICONDUCTOR ON INSULATOR (XOI) FOR HIGH PERFORMANCE FIELD EFFECT TRANSISTORS

(75) Inventors: Ali Javey, Fremont, CA (US); Hyunhyub Ko, Ulsan Metropolitan (KR); Kuniharu Takei, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 144 days.

(21) Appl. No.: 13/175,281

(22) Filed: Jul. 1, 2011

(65) Prior Publication Data

US 2012/0061728 A1 Mar. 15, 2012

Related U.S. Application Data

(60) Provisional application No. 61/361,128, filed on Jul. 2, 2010.

(51) Int. Cl.
*H01L 29/772* (2006.01)
*H01L 29/205* (2006.01)
*H01L 21/20* (2006.01)

(52) U.S. Cl.
USPC .............. 257/192; 257/E21.09; 257/E29.242; 438/458

(58) Field of Classification Search
None
See application file for complete search history.

(56) References Cited

U.S. PATENT DOCUMENTS

| | | | | |
|---|---|---|---|---|
| 6,669,801 B2* | 12/2003 | Yoshimura et al. | ........... | 156/230 |
| 7,932,123 B2* | 4/2011 | Rogers et al. | .................... | 438/73 |
| 2004/0253782 A1* | 12/2004 | Kondo | ........................... | 438/222 |
| 2008/0108171 A1* | 5/2008 | Rogers et al. | .................... | 438/73 |
| 2010/0001316 A1* | 1/2010 | Gmitter et al. | ................ | 257/183 |
| 2010/0151689 A1* | 6/2010 | Gmitter et al. | ................ | 438/745 |
| 2010/0219509 A1* | 9/2010 | He et al. | ........................ | 257/618 |
| 2011/0297916 A1* | 12/2011 | Bennett et al. | .................. | 257/24 |

OTHER PUBLICATIONS

Yablonovitch E., et. al. "Van der Waals bonding of GaAs epitaxial liftoff films onto arbitrary substrates" Appl. Phys. Lett., 65(24), Jun. 1990 pp. 2419-2421.*
Yoon, Jongseung, Sungjin Jo, Ik Su Chun, Inhwa Jung, Hoon-Sik Kim, Matthew Meitl, Etienne Menard, Xiuling Li, James J. Coleman, Ungyu Paik, and John A. Rogers. "GaAs Photovoltaics and Optoelectronics Using Releasable Multilayer Epitaxial Assemblies." Nature 465.7296 (2010): 329-33.*
Sun, Yugang, and John A. Rogers. "Fabricating Semiconductor Nano/Microwires and Transfer Printing Ordered Arrays of Them onto Plastic Substrates." Nano Letters 4.10 (2004): 1953-959.*

(Continued)

*Primary Examiner* — Thomas L Dickey
*Assistant Examiner* — Joseph Schoenholtz
(74) *Attorney, Agent, or Firm* — Saliwanchik, Lloyd & Eisenschenk, P.A.

(57) ABSTRACT

Semiconductor-on-insulator (XOI) structures and methods of fabricating XOI structures are provided. Single-crystalline semiconductor is grown on a source substrate, patterned, and transferred onto a target substrate, such as a $Si/SiO_2$ substrate, thereby assembling an XOI substrate. The transfer process can be conducted through a stamping method or a bonding method. Multiple transfers can be carried out to form heterogenous compound semiconductor devices. The single-crystalline semiconductor can be II-IV or III-V compound semiconductor, such as InAs. A thermal oxide layer can be grown on the patterned single crystalline semiconductor, providing improved electrical characteristics and interface properties. In addition, strain tuning is accomplished via a capping layer formed on the single-crystalline semiconductor before transferring the single-crystalline semiconductor to the target substrate.

26 Claims, 27 Drawing Sheets

(56) References Cited

OTHER PUBLICATIONS

Meitl, Matthew A., Zheng-Tao Zhu, Vipan Kumar, Keon Jae Lee, Xue Feng, Yonggang Y. Huang, Ilesanmi Adesida, Ralph G. Nuzzo, and John A. Rogers. "Transfer Printing by Kinetic Control of Adhesion to an Elastomeric Stamp." Nature Materials 5.1 (2005): 33-38.*

Wang, Chao, Keith J. Morton, Zengli Fu, Wen-Di Li, and Stephen Y. Chou. "Printing of Sub-20 Nm Wide Graphene Ribbon Arrays Using Nanoimprinted Graphite Stamps and Electrostatic Force Assisted Bonding." Nanotechnology 22.44 (2011): 445301.*

Schermer, J. J., P. Mulder, G. J. Bauhuis, M. M. A. J. Voncken, J. Van Deelen, E. Haverkamp, and P. K. Larsen. "Epitaxial Lift-Off for Large Area Thin Film III/V Devices." Physica Status Solidi (a) 202.4 (2005): 501-08.*

E. Yablonovitch, Final Letter Report for FY93 for Contract Title Epitaxial Liftoff Technology onto Processed Silicon Foundary Wafers, ONR N00014-93-1-0311 / AD-A285621 Oct. 1, 1994.*

Fang, H. et al., "Strain engineering of epitaxially transferred, ultrathin layers of III-V semiconductor on insulator," Applied Physics Letters, 201, vol. 98, 012111, pp. 1-3.

Meitl, M. A. et al., "Transfer printing by kinetic control of adhesion to an elastomeric stamp," Nature Materials, Jan. 2006, vol. 5, pp. 33-38.

Wu, Y. Q. et al., "High Performance Deep-Submicron Inversion-Mode InGaAs MOSFETs with maximum Gm exceeding 1.1 mS/μm: New HBr Pretreatment and Channel Engineering," IEEE, Electron Devices Meeting (IEDM), 2009, pp. 13.2.1-4.

Yoon, J. et al., "GaAs photovoltaics and optoelectronics using releasable multilayer epitaxial assemblies," Nature Letters, May 2010, vol. 465, pp. 329-334.

* cited by examiner

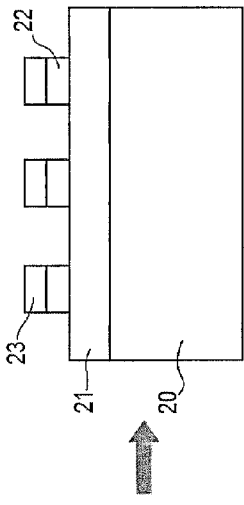
FIG. 4C
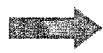
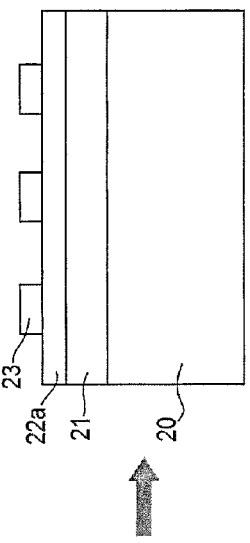
FIG. 4B
FIG. 4A
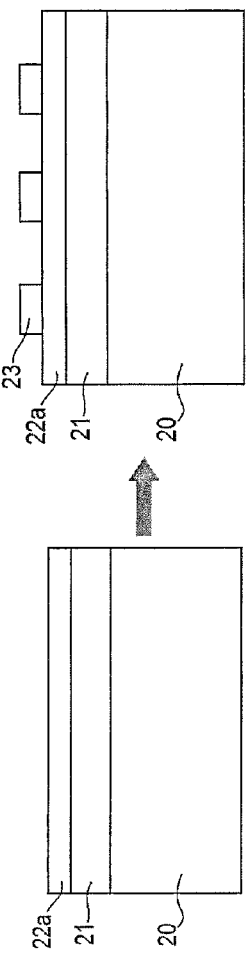
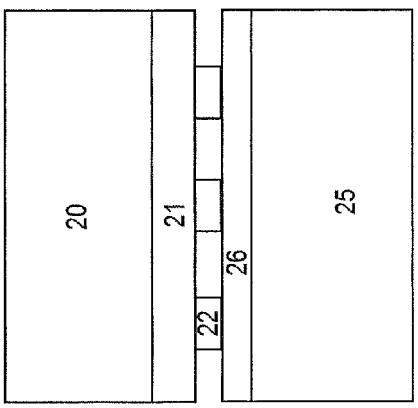
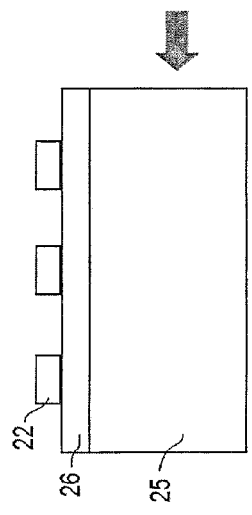

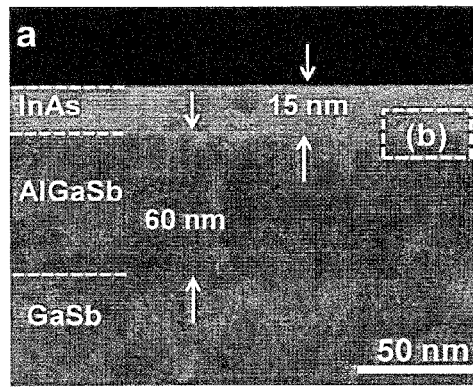 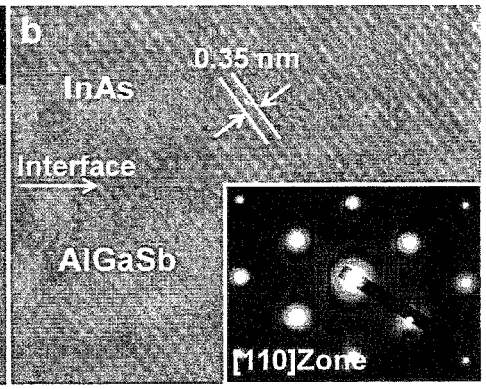
FIG. 5A  FIG. 5B
FIG. 6A
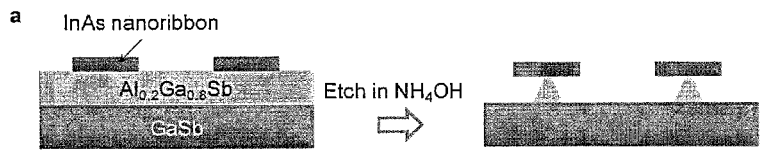
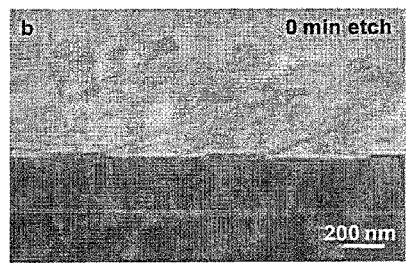 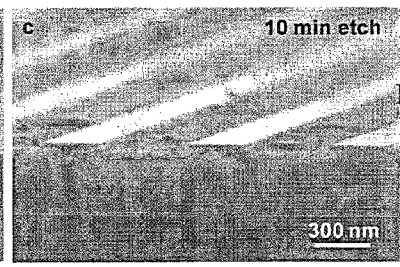
FIG. 6B  FIG. 6C
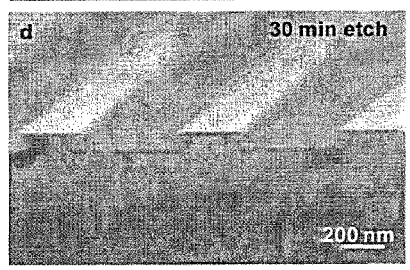 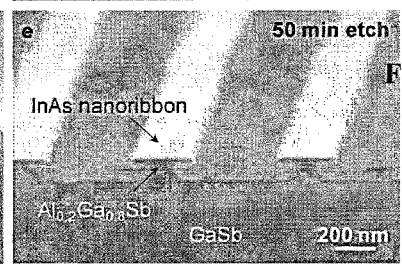
FIG. 6D  FIG. 6E

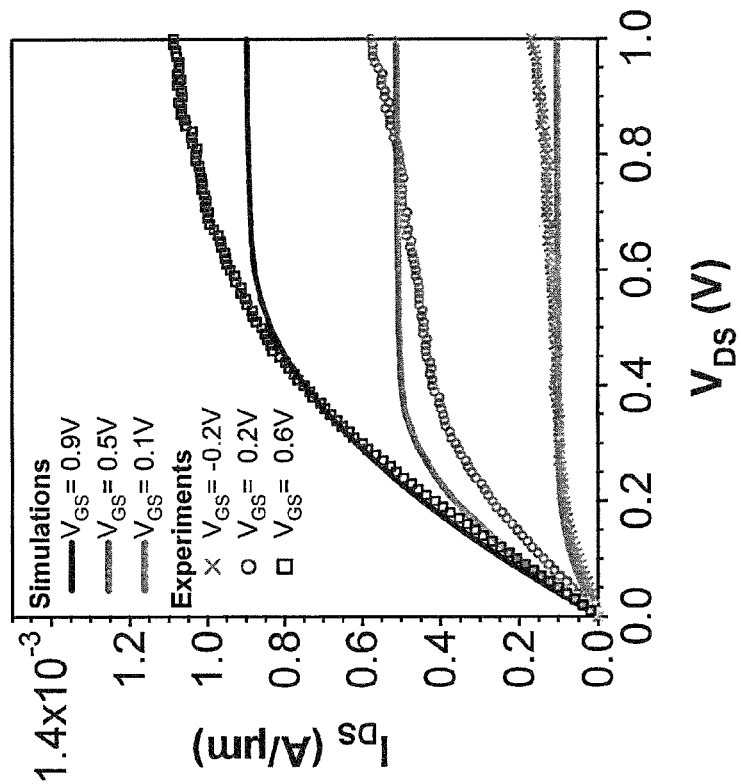
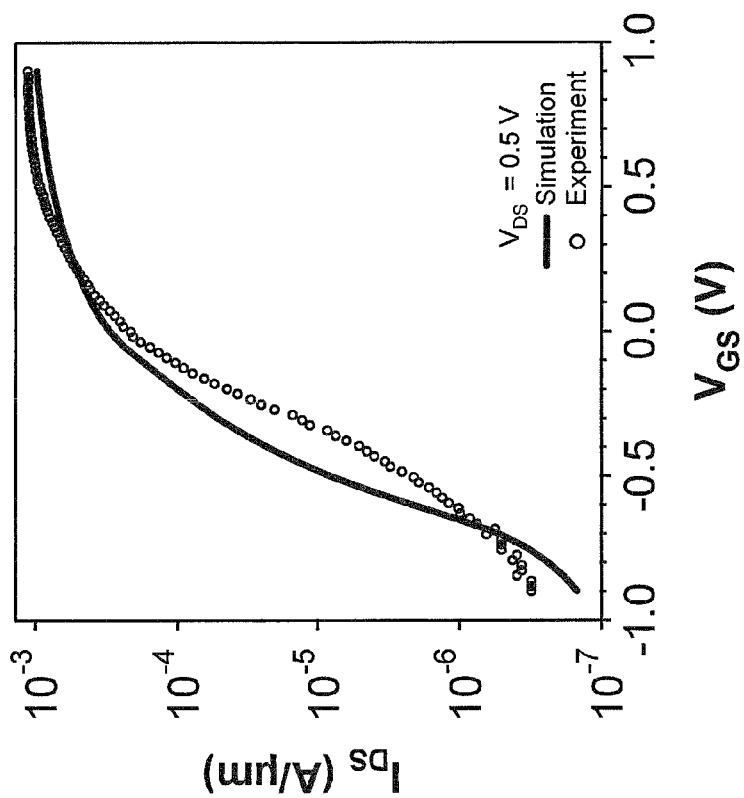
FIG. 11A
FIG. 11B

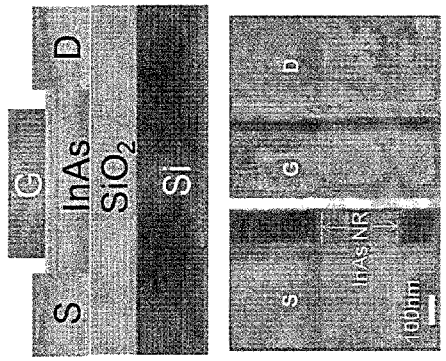
FIG. 12A
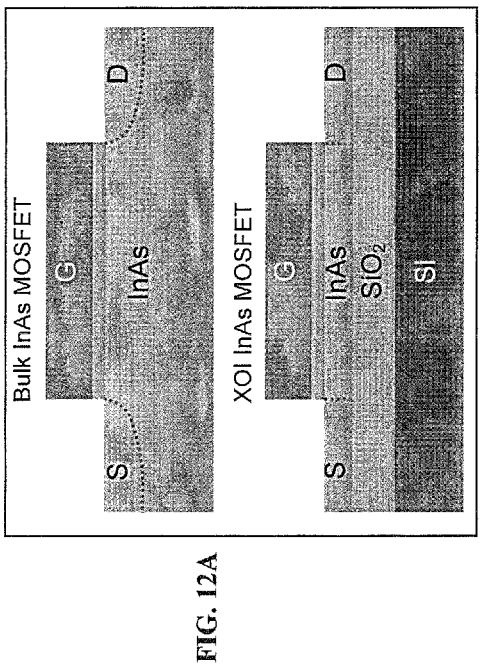
FIG. 12D
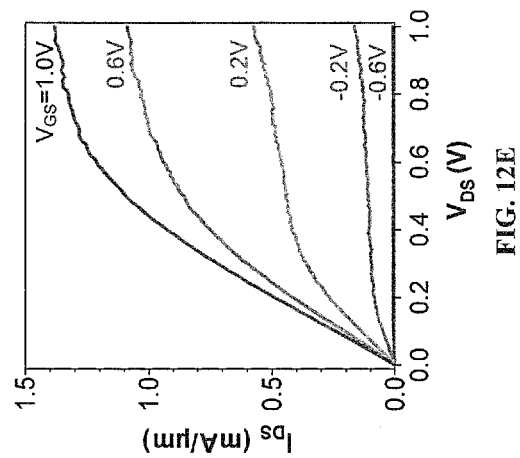
FIG. 12B
FIG. 12C
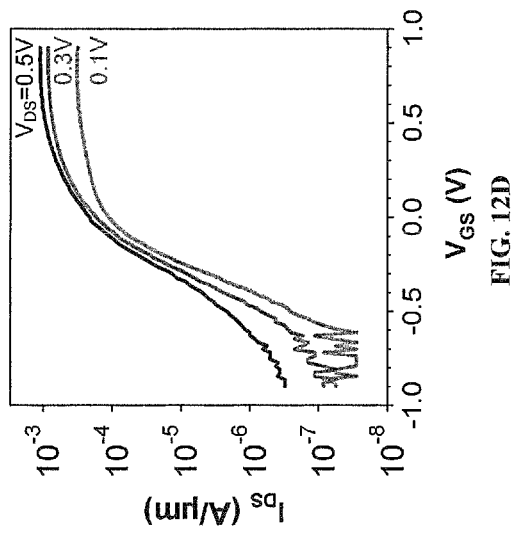
FIG. 12E

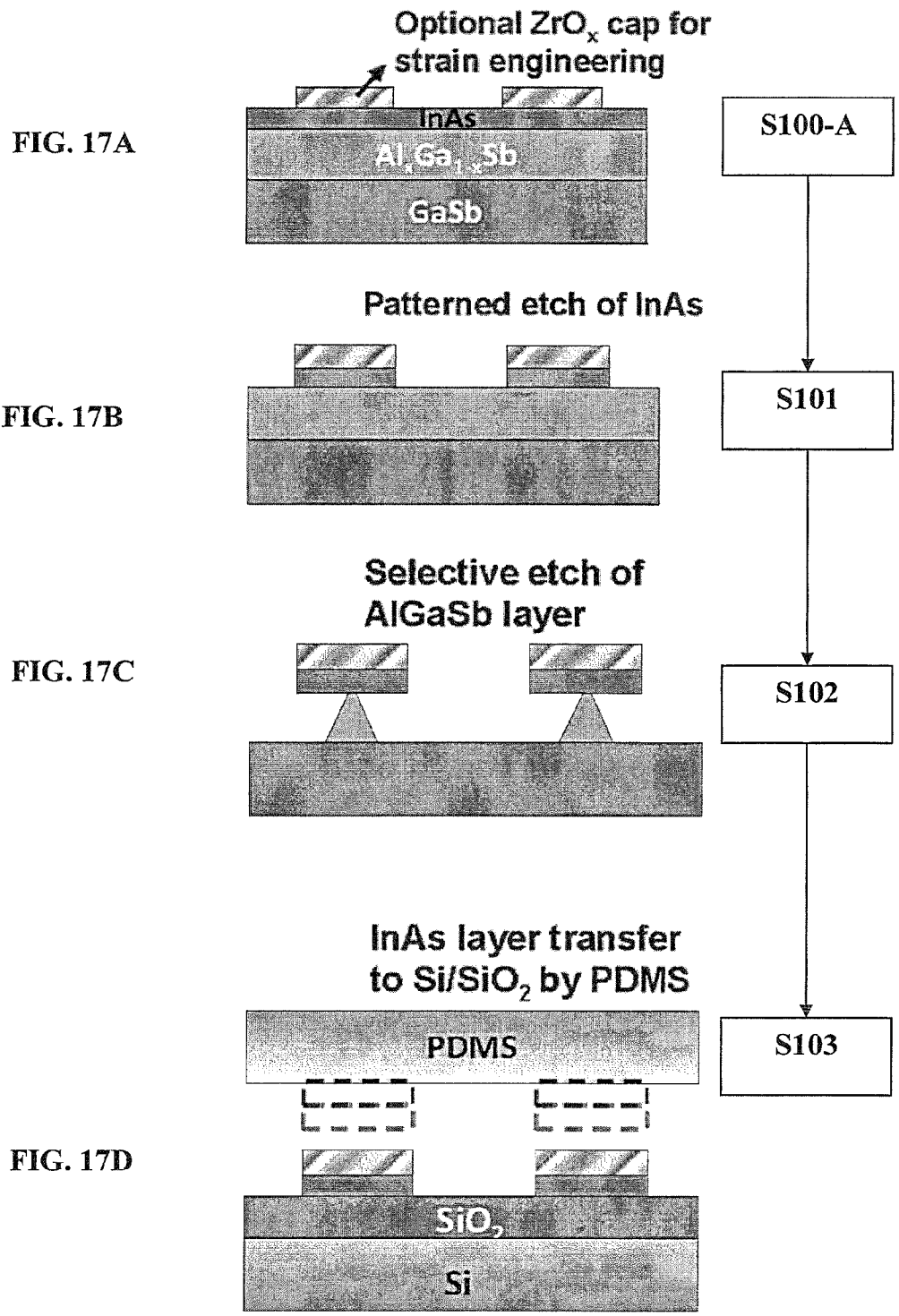

Transferred without cap

Transferred with cap

SEMICONDUCTOR ON INSULATOR (XOI) FOR HIGH PERFORMANCE FIELD EFFECT TRANSISTORS

CROSS-REFERENCE TO RELATED APPLICATION

This application claims the benefit of Provisional Patent Application No. 61/361,128, filed Jul. 2, 2010, which is hereby incorporated by reference in its entirety.

This invention was made with government support under Contract No. HR0011-07-3-0002 awarded by DARPA, Grant No. DMR-0804646 awarded by the National Science Foundation, and Grant No. FA9550-09-1-0202 awarded by the Air Force Office of Scientific Research. The U.S. Government has certain rights in this invention.

BACKGROUND OF THE INVENTION

Silicon technology has dominated modern semiconductor devices as the mainstream technology for industry. In order to sustain Moore's Law, transistor dimensions are shrinking to achieve ever increasing density. However, the inherent physical limitations of performances encountered by the silicon devices has motivated the development of silicon-on-insulator (SOI) or strained-silicon technologies for higher speed and lower power operation of silicon chips.

In addition, over the past several years, the inherent scaling limitations of electron devices have fueled the exploration of high carrier mobility semiconductors as a silicon (Si) replacement to further enhance the device performance. In particular, compound semiconductors heterogeneously integrated on Si substrates have been actively studied, combining the high mobility and low power consumption of III-V semiconductors and the well-established, low cost processing of the Si technology. This integration, however, presents significant challenges. As one approach, heteroepitaxial growth of complex multilayers on Si has been explored. Besides complexity, high defect densities and junction leakage currents present limitations in this approach.

BRIEF SUMMARY

The subject invention provides new and useful structures and methods for semiconductor devices. According to one embodiment of the present invention, a semiconductor-on-insulator (XOI) substrate is provided. The semiconductor portion (i.e., "X") of the XOI substrate has parallels to the silicon-on-insulator (SOI) technology, without the limitation of being only silicon as the device layer on a Si/SiO$_2$ substrate.

According to implementations of the subject XOI technology, single crystal semiconductor material provides the device layer "X" of the XOI substrate. To provide the XOI substrate having the single crystal semiconductor material, the single crystal semiconductor material is grown on a source substrate and transferred to a Si/SiO$_2$ substrate. According to one embodiment of the invention, the epitaxial transfer process is accomplished using a stamping method, where the single crystal semiconductor grown on a source substrate is transferred to the target substrate using a polymer or rubber stamp. According to another embodiment of the invention, the epitaxial transfer process is accomplished using a bonding method.

According to further embodiments of the invention, the same transfer methods can be used to provide single crystal semiconductor materials on a CMOS substrate after formation of an interlayer dielectric layer or a top dielectric layer. According to one such embodiment, CMOS devices can be fabricated using conventional silicon technology and single crystal semiconductor material devices can be formed on a dielectric layer on the CMOS devices, providing compatibility with CMOS chips.

In accordance with an embodiment of the invention, a thermal oxide is grown on the single crystal semiconductor material and transferred onto the target substrate with the single crystal semiconductor material such that the thermal oxide is disposed between the semiconductor material and the target substrate. The thermal oxide can provide a high quality interface between the semiconductor material and the dielectric, such as the SiO$_2$ layer, on the target substrate.

In various embodiments, compound semiconductors, such as II-IV and III-V compound semiconductors, are grown and then transferred to a target substrate as a device layer. The compound semiconductors can be formed ultrathin, enabling particular device characteristics.

In accordance with certain embodiments of the invention, electrical properties, including drain/source current and carrier mobility of XOI field effect transistors (FETs) can be controlled by changing the thickness of the compound semiconductor of the X device layer.

In a specific embodiment, the ultrathin compound semiconductor is In$_x$As$_y$Sb$_z$ where x and y are positive numbers and z is 0 or a positive number. According to one such specific embodiment, the source substrate is a GaSb substrate with an AlGaSb sacrificial layer. The GaSb/AlGaSb structure can provide an advantageous platform for the growth of the In$_x$As$_y$Sb$_z$ film. The number of Al atoms to Ga atoms in the AlGaSb (sacrificial layer) composition can be adjusted. In certain embodiments, a higher Al concentration can improve etching selectivity between the AlGaSb sacrificial layer and the In$_x$As$_y$Sb$_z$ compound semiconductor when etching the sacrificial layer. The In$_x$As$_y$Sb$_z$ compound semiconductor can be grown to a thickness on the AlGaSb sacrificial layer for enabling full-depletion mode operation of a transistor formed therefrom. The In$_x$As$_y$Sb$_z$ composition can be in the form of InAs$_m$Sb$_{1-m}$.

According to certain embodiments, the InAsSb compound semiconductor material can be used to form n-FETs on the device substrate.

In another specific embodiment, the ultrathin compound semiconductor is InGaSb, which can take the form of In$_n$Ga$_{1-n}$Sb. The InGaSb layer can be fabricated in a heterostructure with InAs surface cladding layers on the top and bottom surfaces of the InGaSb layer (InAs/InGaSb/InAs). According to one such specific embodiment, the source substrate is a GaSb substrate with an AlGaSb sacrificial layer.

According to certain embodiments, the InGaSb can be grown and transferred onto the device substrate to form in p-FETs.

According to one aspect of the invention, III-V CMOS electronics via XOI structures can be realized by using embodiments of the subject epitaxial layer transfer methods for forming n-FETs and p-FETs.

In a further embodiment, a capping layer formed for the transferring process of the X layer from the source substrate to a target substrate is used to adjust the strain of the X layer in the target substrate, providing an option for tuning the strain level of the X layer for a desired device application.

BRIEF DESCRIPTION OF THE DRAWINGS

FIGS. 4A-4F show schematic diagrams of an XOI fabrication scheme in accordance with the second embodiment of the invention.

FIGS. 5A and 5B show a cross-sectional TEM analysis of a GaSb/AlGaSb/InAs source substrate fabricated in accordance with an embodiment of the invention. FIG. 5A shows a TEM image of the InAs thin film grown on an $Al_{0.2}Ga_{0.8}Sb$ layer on a bulk GaSb wafer and FIG. 5B shows a HRTEM image of the single-crystalline structure of the InAs thin film on AlGaSb. The corresponding diffraction pattern is shown in the inset of FIG. 5B, indicating the [110] zone.

FIGS. 6A-6E illustrate selective etching of a sacrificial layer in accordance with an embodiment of the invention. FIG. 6A shows schematic illustrations of the selective etching of AlGaSb; and FIGS. 8B-8E show scanning electron microscopy (SEM) images of InAs NRs on the source substrate after the wet etching of the AlGaSb layer for 0 min (FIG. 6B), 10 min (FIG. 6C), 30 min (FIG. 6D), and 50 min (FIG. 6E).

FIG. 7A shows a single transfer of InAs arrays on the $Si/SiO_2$ substrate; FIG. 7B shows a close-up view of the InAs NR array layer of FIG. 7A; FIG. 7C shows an InAs NR superstructure having two layers of perpendicularly oriented NR arrays on the $Si/SiO_2$ substrate by a multiple transfer of InAs NR arrays; and FIG. 7D shows a close-up view of the two InAs NR array layers.

FIGS. 8A-8C show a cross-sectional transmission electron microscopy (TEM) analysis of InAs XOI substrates fabricated in accordance with an embodiment of the invention. FIG. 8A shows a TEM image of an array of three InAs NRs on a $Si/SiO_2$ substrate; FIG. 8B shows a magnified TEM image of an individual InAs NR on the $Si/SiO_2$ substrate; and FIG. 8C shows a high-resolution TEM (HRTEM) image of an InAs NR interface with $ZrO_2$ and $SiO_2$ layers on the top and bottom surfaces, respectively.

FIG. 9B also shows a plot of calculated phonon mobility as a function of thickness.

FIGS. 11A and 11B show plots of transfer characteristics (FIG. 11A) and output characteristics (FIG. 11B) of a top gated InAs XOI FET according to an embodiment of the invention, comparing experiment and simulation characteristics.

FIG. 12A shows schematic illustrations of an InAs bulk MOSFET (top) and an InAs XOI MOSFET (bottom) according to an embodiment of the invention.

FIGS. 12B and 12C show a device schematic and a representative SEM image, respectively, of a top-gated FET according to an embodiment of the invention.

FIGS. 12D and 12E show graphs of transfer characteristics (FIG. 12D) and output characteristics (FIG. 12E) of a top-gated InAs XOI FET according to an embodiment of the invention.

at $V_{DS}=0.5$ as a function of $V_{GS}$ obtained from the $I_{DS}$-$V_{GS}$ data shown in FIG. 12E. The dashed line represents the obtained transconductance after current differentiation, and the solid line represents the transconductance after $2^{nd}$ order Savitsky-Golay smoothing.

Figure 16:
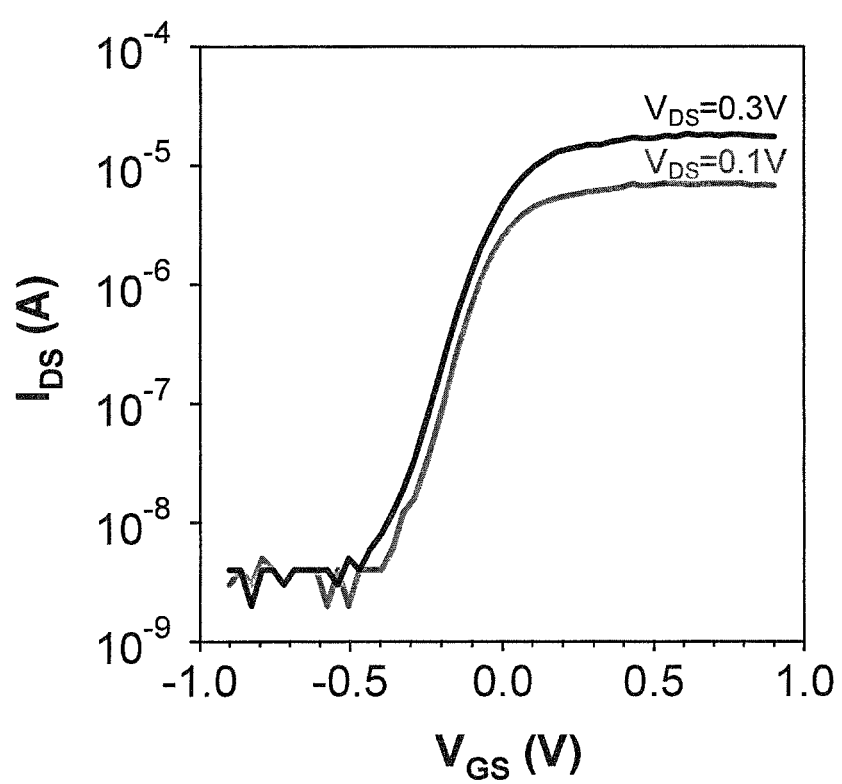

FIG. 16 shows $I_{DS}$-$V_{GS}$ characteristics of a top-gated InAs XOI FET for $V_{DS}=0.3V$ and $V_{DS}=0.1$ V.

FIGS. 17A-17D show schematic diagrams of an XOI fabrication scheme and process flow in accordance with an embodiment of the invention.

Figure 18A:
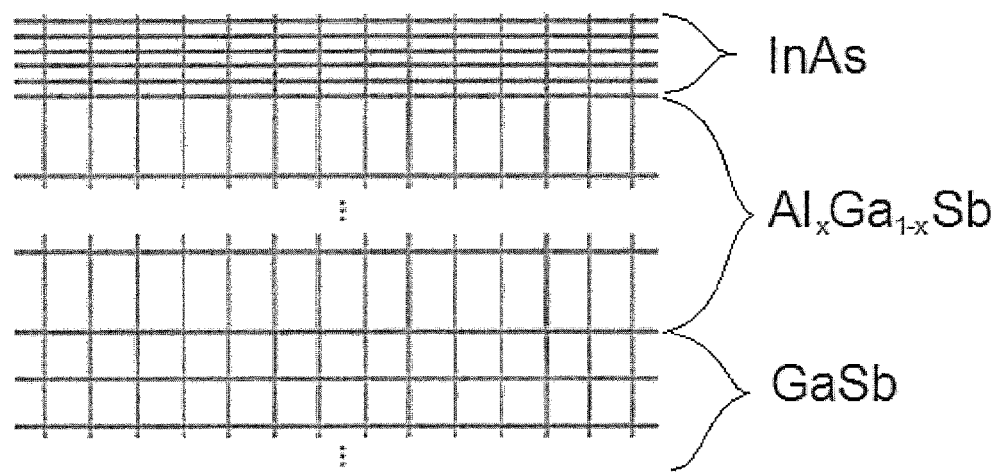
Figure 18B:
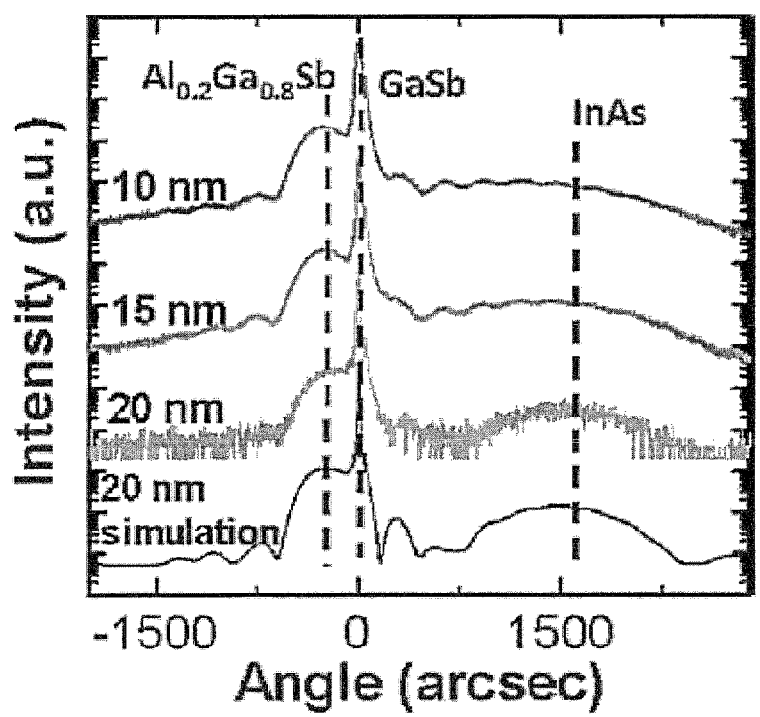

FIGS. 18A and 18B show an assumed strain state for each layer of a GaSb/AlGaSb/InAs source wafer structure (FIG. 18A) and a HRXRD spectra plot (referenced to GaSb substrate peak) of a GaSb/Al0.2Ga0.8Sb/InAs source wafer with different InAs thicknesses (FIG. 18B).

Figure 19A:
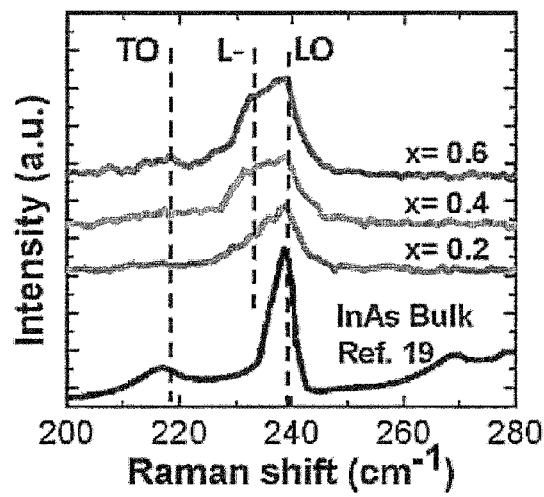
Figure 19B:
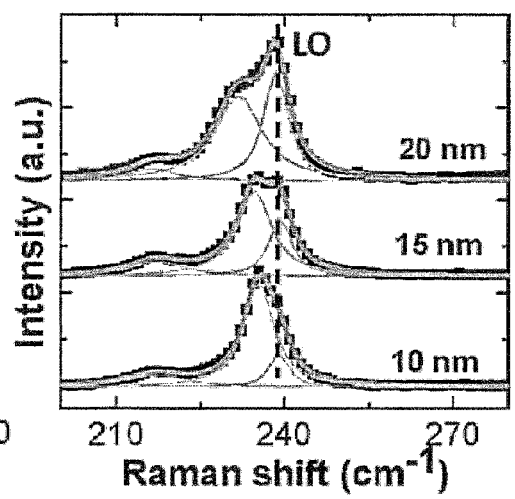
Figure 19C:
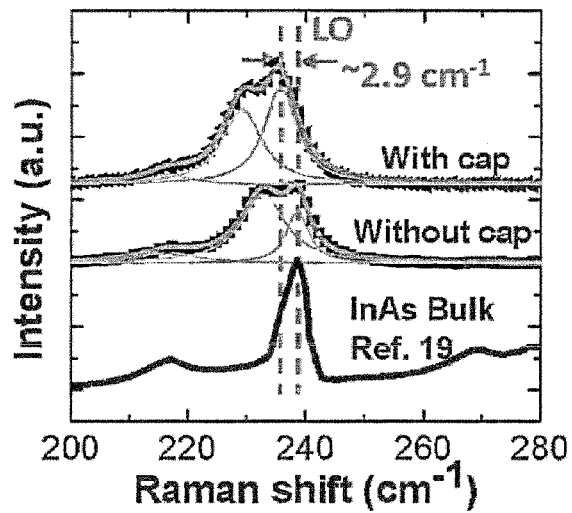

FIGS. 19A-19C shows plots of Raman spectra of XOI samples in accordance with embodiments of the invention. FIG. 19A shows Raman spectra of XOI samples ($h_{InAs}=20$ nm) obtained from $GaSb/Al_xGa_{1-x}Sb/InAs$ source wafers with x=0.2, 0.4, and 0.6; FIG. 19B shows Raman spectra of XOI samples with different InAs thicknesses; and FIG. 19C shows Raman spectra of relaxed and strained InAs XOI samples when transferred with and without the use of a $ZrO_x$ capping layer.

Figure 20A:
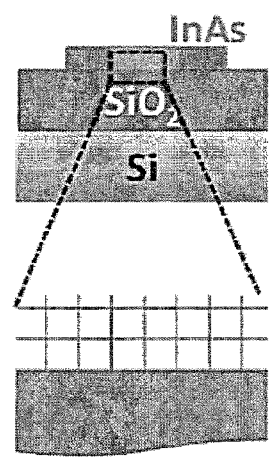
Figure 20B:
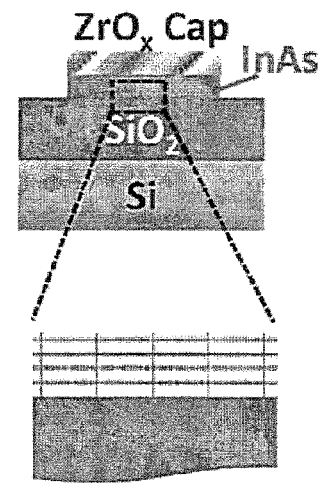

FIGS. 20A and 20B show schematic illustrations of lattices of relaxed InAs XOI (FIG. 20A) and strained InAs XOI (FIG. 20B) in accordance with certain embodiments of the invention.

Figure 21:
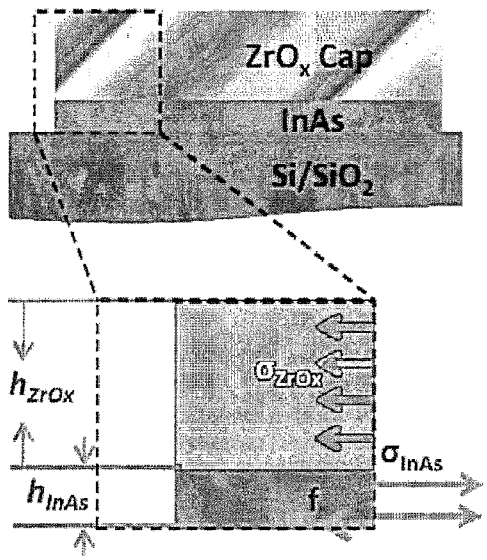

FIG. 21 shows a schematic illustration of the stress distribution across a cross-section of a $ZrO_x$ cap and InAs layer transferred onto a $Si/SiO_2$ substrate in accordance with an embodiment of the invention.

Figure 22:
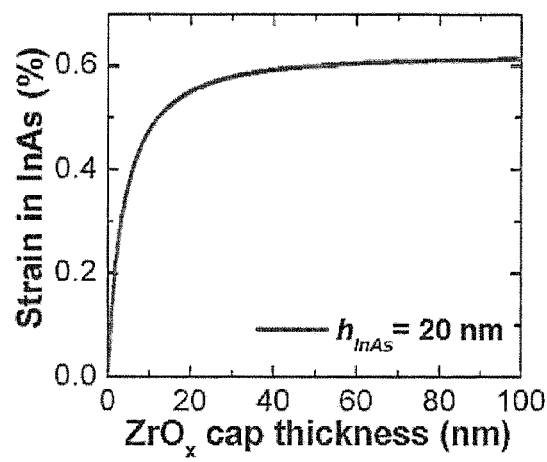

FIG. 22 shows a plot indicating dependence of the strain (e) in the InAs XOI layer of an embodiment of the invention ($h_{InAs}=20$ nm) on the $ZrO_x$ cap thickness ($h_{ZrOx}$ of FIG. 21).

Figure 23A:
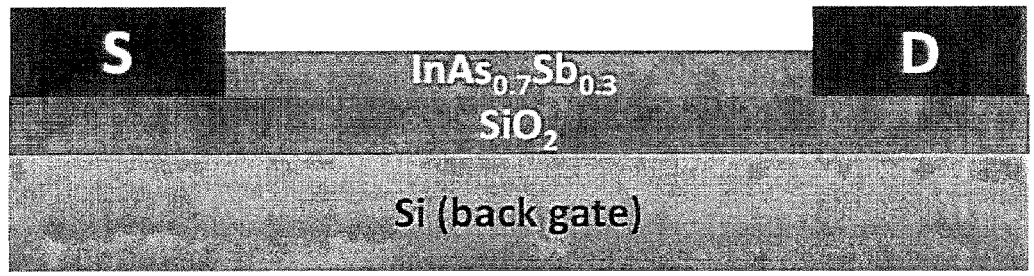
Figure 23B:
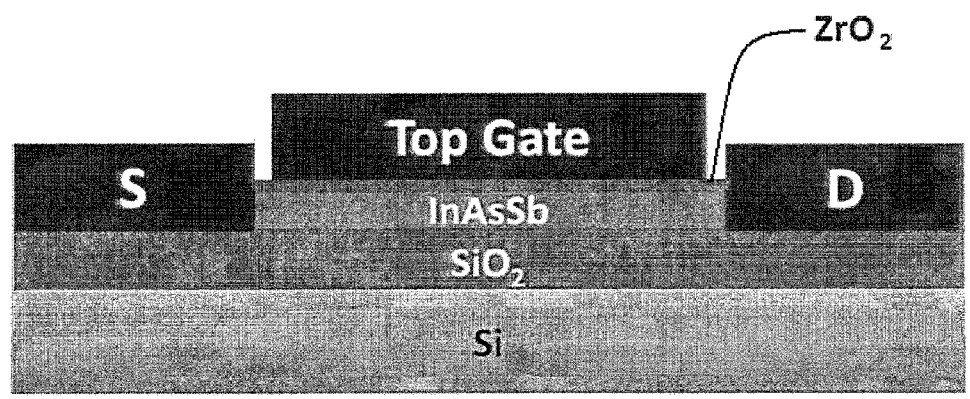
Figure 23C:
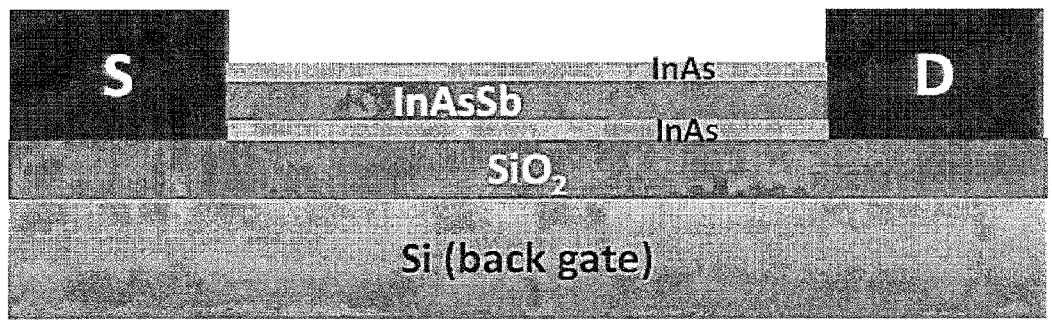

FIGS. 23A-23C show cross-sectional views of FET structures in accordance with certain embodiments of the invention. FIG. 23A shows a hack-gated InAsSb XOI device of an embodiment of the invention; FIG. 23B shows a top-gated InAsSb XOI device of an embodiment of the invention; and FIG. 23C shows a back-gated InAs/InAsSb/InAs heterostructure XOI of an embodiment of the invention.

Figure 24A:
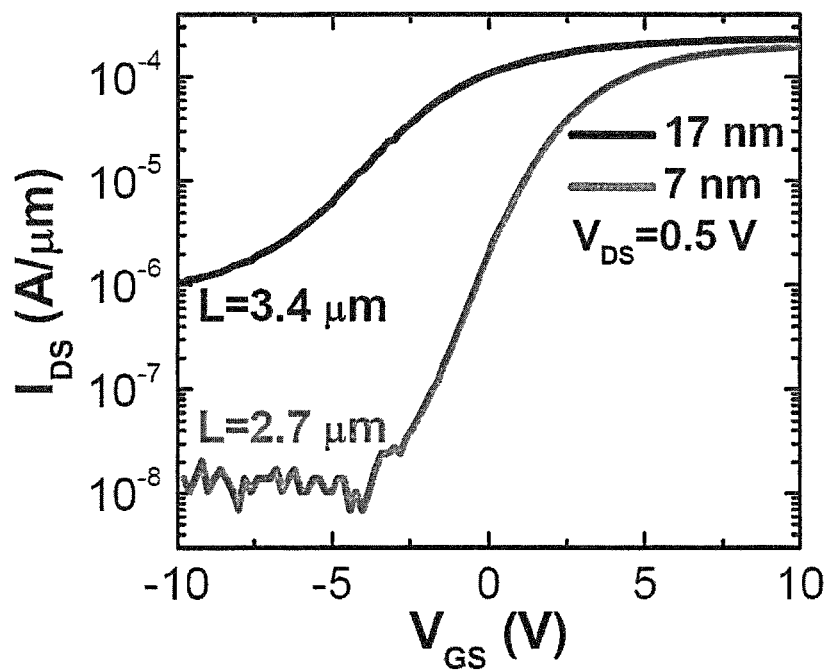

FIG. 24A shows $I_{DS}$-$V_{GS}$ curves for 7 nm and 17 nm thick InAs$_{0.7}$Sb$_{0.3}$ back-gated XOI nFETs of an embodiment of the invention with 50 nm SiO$_2$ as the back-gate dielectric.

Figure 24B:
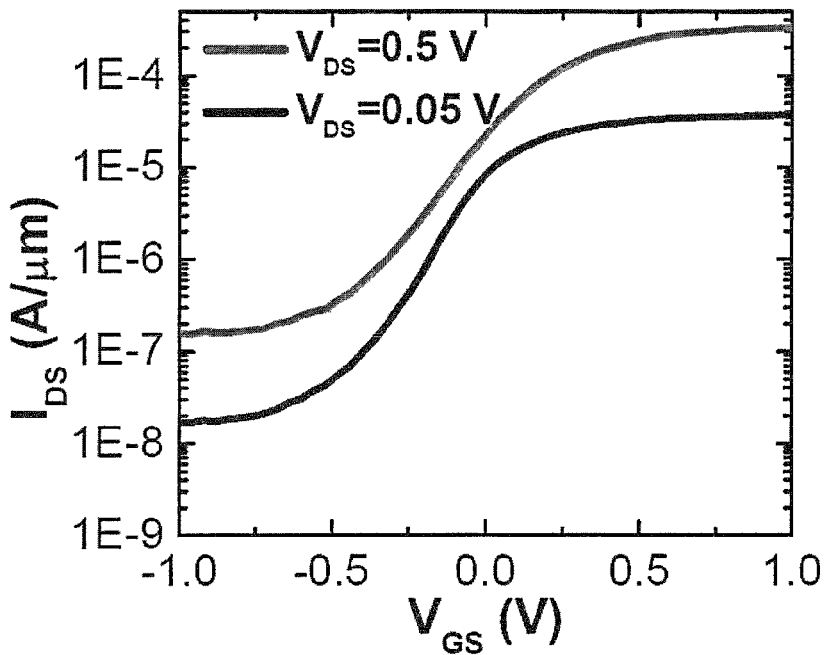

FIG. 24B shows $I_{DS}$-$V_{GS}$ curves at $V_{DS}$=0.05 V and 0.5 V for a 7 nm thick InAs$_{0.7}$Sb$_{0.3}$ top-gated XOI nFET of an embodiment of the invention with a gate length of ~500 nm.

FIGS. 25A-25D illustrate a process schematic for the fabrication of InAs/InGaSb/InAs heterostructure XOI.

Figure 26A:
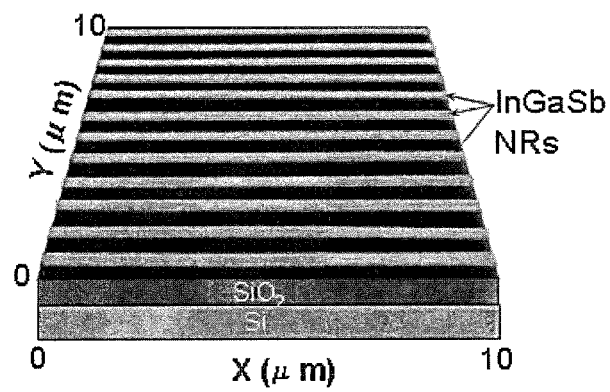
Figure 26B:
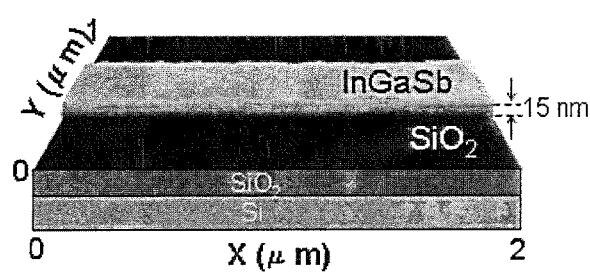

FIGS. 26A and 26B show AFM images of transferred InAs/InGaSb/InAs nanoribbons on a Si/SiO$_2$ substrate according to an embodiment of the invention.

Figure 27:
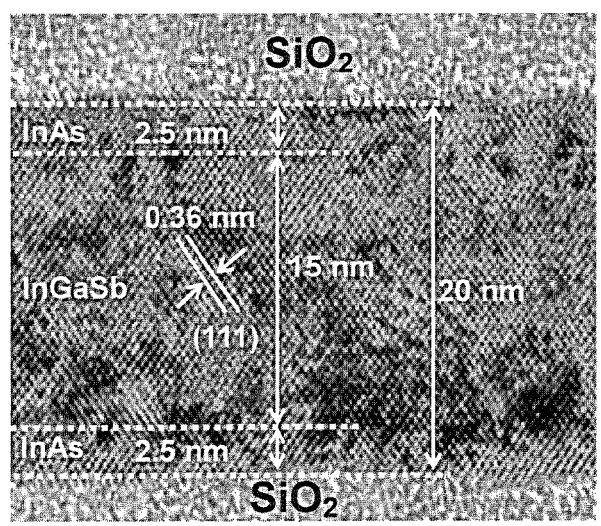

FIG. 27 shows a TEM image of the InAs/InGaSb/InAs XOI of an embodiment of the invention.

Figure 28A:
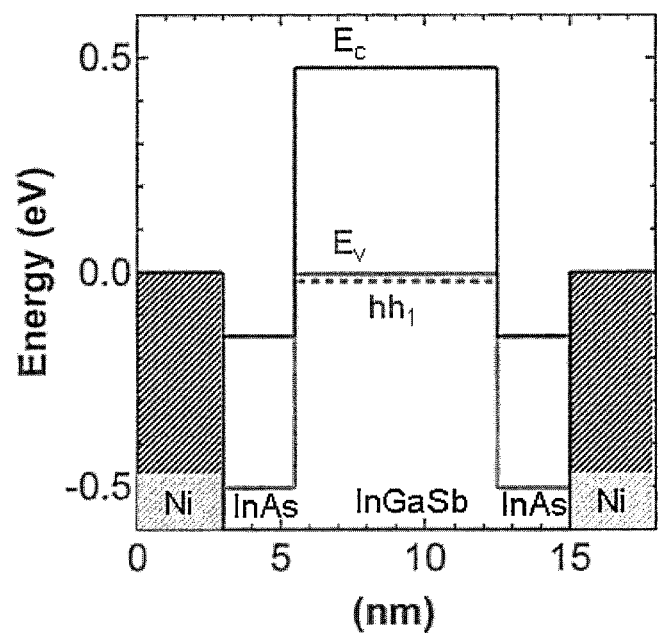
Figure 28B:
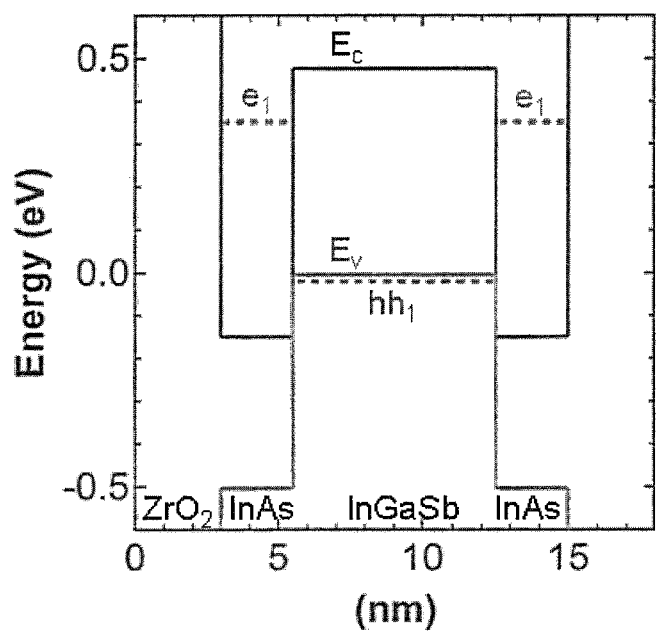

FIGS. 28A and 28B show energy band diagrams of the region under the source/drain metal contacts (FIG. 28A) and the channel region (FIG. 28B).

Figure 29:
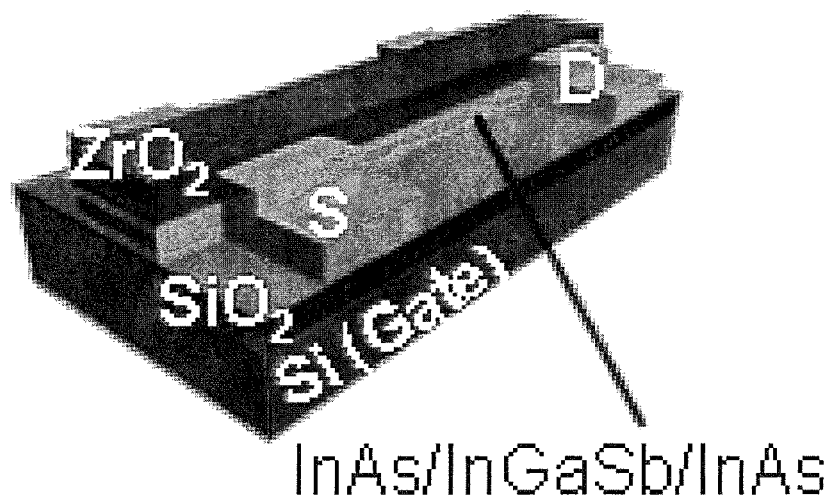

FIG. 29 shows a representation of a back-gated pFET according to an embodiment of the invention.

Figure 30:
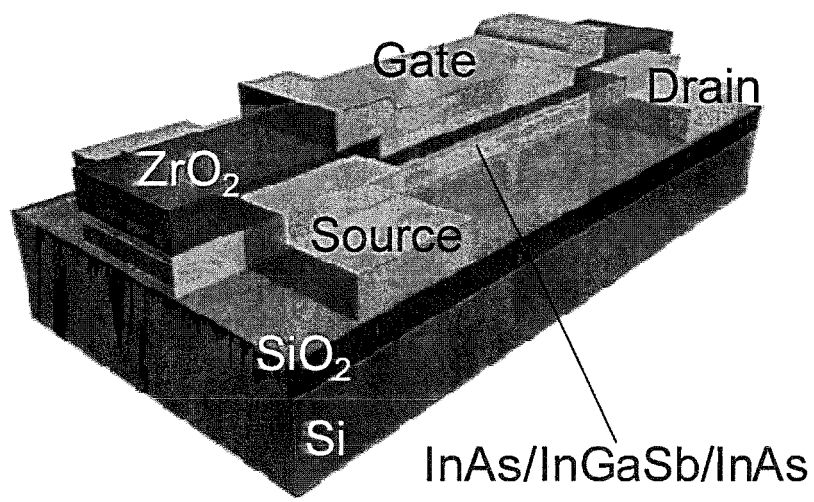

FIG. 30 shows a representation of a top-gated pFET according to an embodiment of the invention.

FIGS. 31A-31G illustrate electrical characteristics of a back-gated pFET of a specific embodiment of the invention.

Figure 32A:
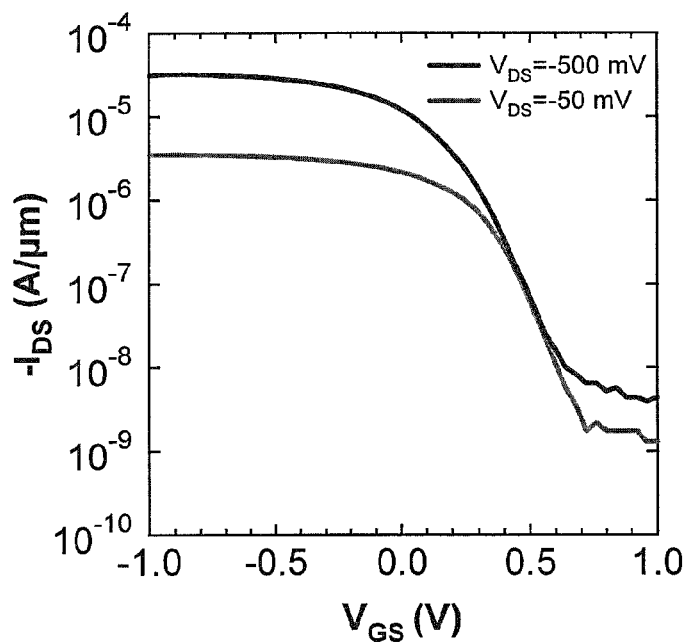
Figure 32B:
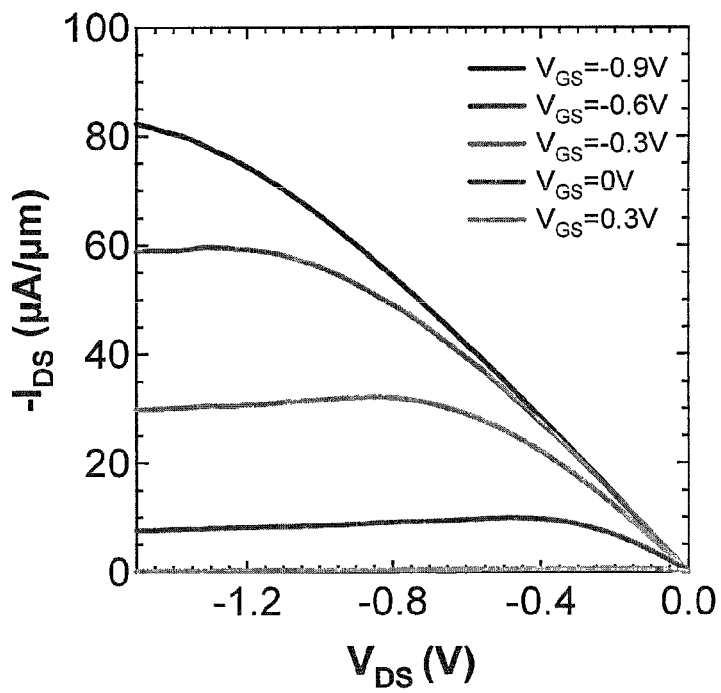

FIGS. 32A and 32B illustrate electrical characteristics of a top-gated pFET of a specific embodiment of the invention.

DETAILED DISCLOSURE

Semiconductor-on-insulator (XOI) structures and methods of fabricating XOI structures are provided. The XOI structure utilizes single crystalline semiconductor (including compound semiconductor) materials as a device layer instead of being limited to a silicon device layer as with conventional SOI structures.

According to certain implementations of the subject XOI technology, single crystal semiconductor material is grown on a source substrate and transferred to a Si/SiO$_2$ substrate to provide the XOI substrate from which devices are formed. In various embodiments, compound semiconductors, such as II-IV and III-V compound semiconductors, are grown and then transferred to a target substrate as the device layer. The compound semiconductors can be formed ultrathin, enabling particular device characteristics.

The transfer process can be performed multiple times to transfer separately grown semiconductor material onto the target substrate, enabling the fabrication of both p- and n-type transistors on the same chip for complementary electronics based on the optimal III-V semiconductors. For example, high speed, low power complementary structures using high mobility InGaSb and InAs (or InAsSb) ultrathin layers as the p- and n-type materials, respectively, can be formed through a multi-step transfer process.

Accordingly, the subject XOI technology can be used for generic heterogeneous and/or hierarchical assembly of crystalline semiconducting materials.

For example, in one embodiment, InAs can be transferred to a Si/SiO$_2$ substrate to provide N-type structures in a first step and a different compound semiconductor, such as GaSb, can be transferred to the Si/SiO$_2$ substrate to provide P-type structures in a second step. Of course, the order of the two steps can be modified. According to certain embodiments, an In$_x$As$_y$Sb$_z$ (where x and y are positive numbers and z is 0 or a positive number) compound semiconductor material can be grown and transferred onto a device substrate to form n-FETs on the device substrate and an In$_s$Ga$_t$Sb$_u$ (where s is 0 or a positive number and t and u are positive numbers) compound semiconductor material can be grown and transferred onto a device substrate to form p-FETs.

In certain embodiments, the In$_x$As$_y$Sb$_z$ (where x and y are positive numbers and z is 0 or a positive number) compound semiconductor material is in the form InAs$_m$Sb$_{1-m}$ for use as a channel material of a high mobility InAsSb-on-insulator n-FET. In one such specific embodiment, InAs$_{0.7}$Sb$_{0.3}$ is used for the channel material of digital logic structures.

In certain embodiments, the In$_s$Ga$_t$Sb$_u$ (where s is 0 or a positive number and t and u are positive numbers) compound semiconductor material is in the form In$_m$Ga$_{1-m}$Sb for use as a channel material of a high mobility InGaSb-on-insulator p-FET. For the InGaSb and InAsSb XOI structures, thin (i.e., thinner than the active layer of InGaSb or InAsSb) InAs layers can be formed on the top and bottom surfaces of the InGaSb or InAsSb layers.

In accordance with certain embodiments of the invention, electrical properties, including drain/source current and carrier mobility of XOI field effect transistors (FETs) can be controlled by changing the thickness of the semiconductor material of the X device layer. For example, as the thickness is reduced, the semiconductor material may exhibit 2D characteristics instead of bulk (3D) characteristics. The thickness of the semiconductor material can affect OFF current and ON current of a device. For example, InAs exhibits low OFF current at thinner thicknesses, while exhibiting higher mobility and ON current at thicker thicknesses, resulting in a trade-off.

Figure 1:
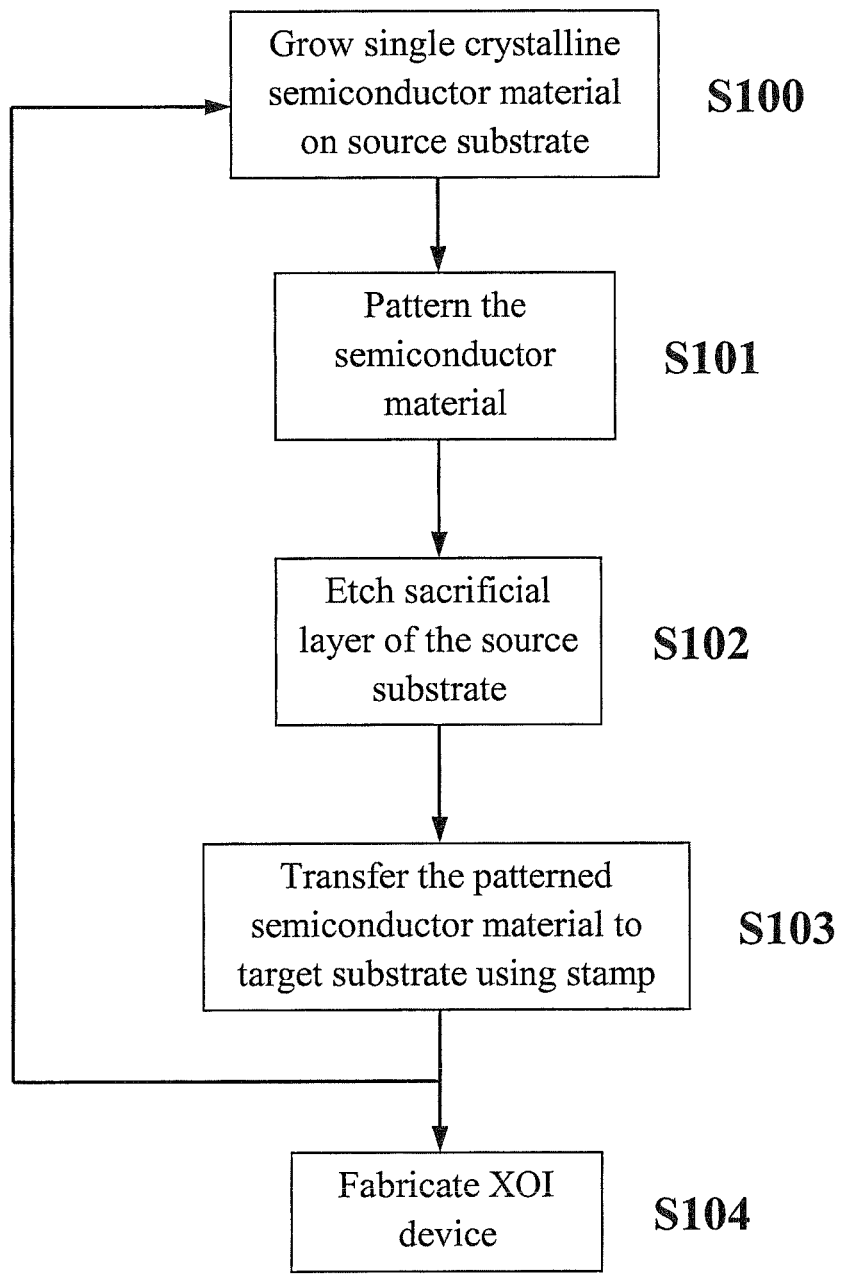
FIG. 1 shows a block diagram process flow of an XOI fabrication scheme in accordance with a first embodiment of the invention.

According to one embodiment of the invention, an epitaxial transfer process of the single crystal semiconductor material onto a target substrate is accomplished using a stamping method. Referring to FIG. 1, for the epitaxial transfer process using a stamping method, single crystal semiconductor material is grown to a predetermined thickness on a source substrate (S100). The source substrate includes a base material (or handle substrate) and a sacrificial layer on the base material. A patterning process can be performed to affect the geometry and/or shape of the single crystal semiconductor material (S101). For example, a mask layer can be formed on the single crystal semiconductor material and a photolithography process can be carried out to define a mask layer pattern corresponding to a nanoribbon (NR) shape or other geometry on the single crystal semiconductor material and the single crystal semiconductor material can be etched using the mask layer pattern as an etch mask to form NRs (or other geometry) of the single crystal semiconductor material on the sacrificial layer of the source substrate. The mask layer pattern is removed, and the sacrificial layer is etched (S102) in order to facilitate the release (detachment) of the single crystal semiconductor NRs (or other geometry) from the source substrate. The etchant for sacrificial layer etchant should have a high selectivity with the single crystal semiconductor material in order to inhibit etching of the single crystal semiconductor NRs (or other geometry) during the etching of the sacrificial layer.

The single crystal semiconductor NRs (or other geometry) are then transferred to a target substrate using a stamp (S103). The stamp can be a rubber, such as an elastomeric polydimethylsiloxane (PDMS), or other polymer-based stamp. According to embodiments, the transfer is achieved without the use of adhesive layers, allowing for purely inorganic interfaces with low interface trap densities. For example, the stamp can be placed directly on the patterned single crystal semiconductor to detach the partially released (from the etching of the sacrificial layer) patterned single crystal semiconductor. The stamp (having the detached patterned single crystal semiconductor) is then placed on the target substrate to transfer the patterned single crystal semiconductor onto the target substrate.

An optional thermal oxide (not shown) can be formed on the patterned semiconductor material before transferring the patterned semiconductor material to the target substrate.

For many XOI applications, the target substrate can be a Si/SiO$_2$ substrate. In certain XOI applications, the target substrate may have different base materials so long as a dielectric layer (or other material having a stronger interaction with the crystal semiconductor material than the material of the stamp) is provided for the single crystal semiconductor to be transferred onto. The growth and transfer process (S100-S103) can be carried out multiple times to create superstructures having multiple patterned crystalline semiconductor layers. Once the growth and transfer process (S100-S103) is complete, an XOI device, such as an XOI FET can be fabricated on the target substrate having the transferred device layer thereon (S104).

FIGS. 2A-2F illustrate a stamping method transfer process that can be used to form an XOI substrate according to a specific embodiment of the invention. The process described with respect to FIGS. 2A-2F refers to an epitaxial transfer scheme for integrating ultrathin InAs layers with nanometer-scale thicknesses on Si/SiO$_2$ substrates (i.e., assembly of an InAs XOI substrate) for use as high performance nanoscale transistors. However, this process should not be construed as limited to the specific materials described herein. For example, other II-IV and III-V compound semiconductors can be used.

Figure 2:
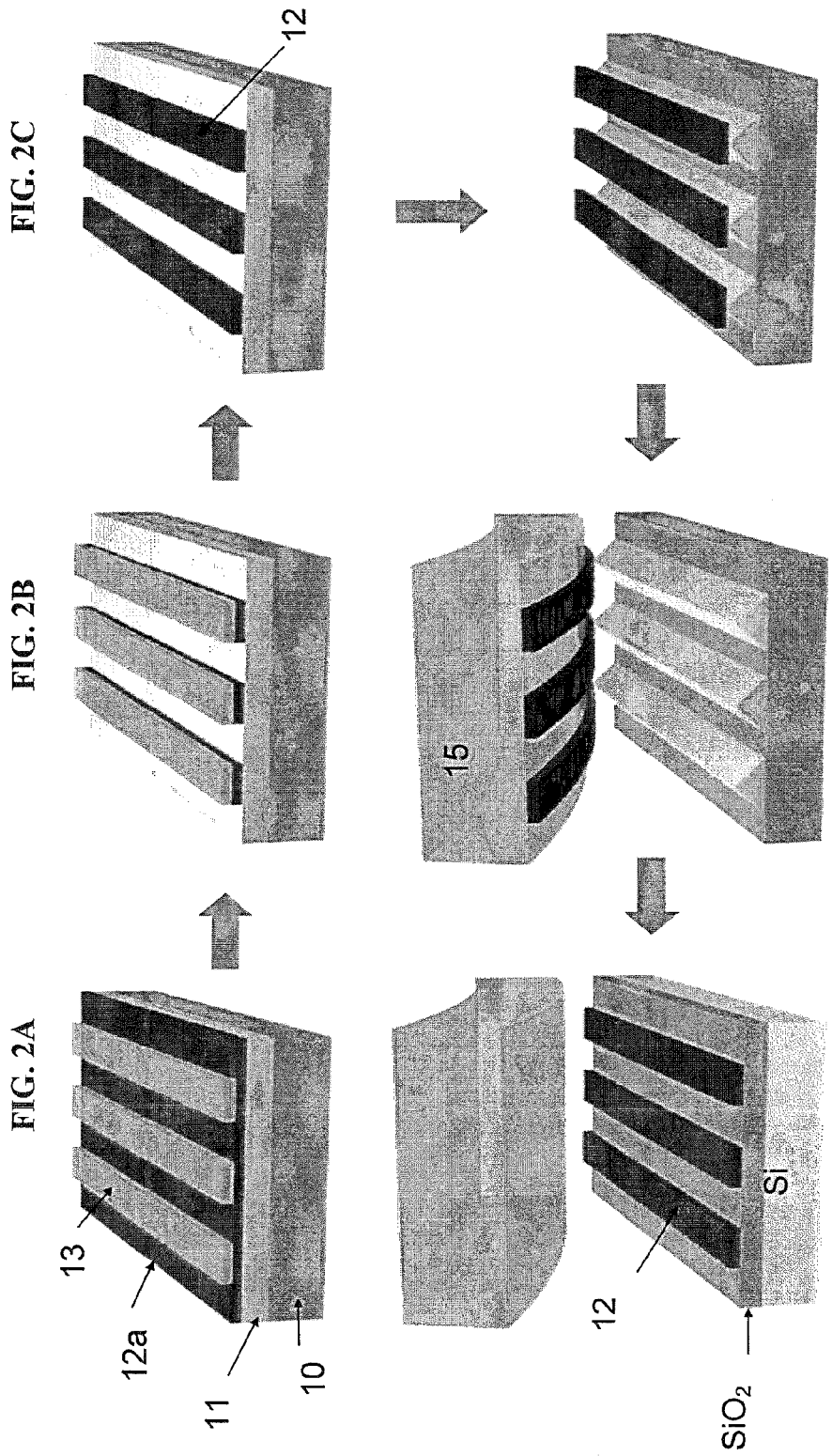
FIGS. 2A-2F show schematic diagrams of an XOI fabrication scheme and process flow in accordance with the first embodiment of the invention.

Referring to FIG. 2A, a single-crystalline InAs film 12a is grown on source substrate, and an etch mask pattern 13 is formed on the single-crystalline InAs film 12a. According to one embodiment, the source substrate includes a GaSb substrate 10 with an AlGaSb sacrificial layer 11 as a platform. In certain embodiments, an Al$_x$Ga$_{1-x}$Sb (0.2=x=1) sacrificial layer can be used. The ratio of Al atoms to Ga atoms in the AlGaSb composition of the sacrificial layer can be adjusted. Increasing the Al concentration can improve etching selectivity for the subsequent sacrificial layer etch. In certain embodiments, the single-crystalline InAs film 12a can be formed of In$_x$As$_y$Sb$_z$ where x and y are positive numbers and z is 0 or a positive number. The In$_x$As$_y$Sb$_z$ compound semiconductor can be grown to a thickness on the AlGaSb sacrificial layer for enabling full-depletion mode operation of a transistor formed therefrom. In one embodiment, the etch mask pattern 13 is formed of PMMA. The PMMA etch mask 13 can be defined using lithography processes.

Referring to FIGS. 2B-2C, the epitaxially grown, single-crystalline InAs film 12a is wet etched using the etch mask pattern 13 as an etch mask to form NR arrays 12. According embodiments of the invention, the initial epitaxial growth process is used to control the thickness of the transferred InAs NRs, while the etch mask is used to tune the length and width.

Referring to FIG. 2D, the underlying AlGaSb sacrificial layer 11 can be etched by performing a selective wet etch, enabling detachment of the InAs NRs 12 from the source substrate.

Referring to FIG. 2E, the InAs NRs 12 are detached from the source substrate using a stamp 15. The stamp 15 can be an elastomeric PDMS slab. The stamp 15 having the detached InAs NRs 12 is applied to a Si/SiO$_2$ target substrate, and the interaction between the InAs NRs (or the optional thermal oxide on the InAs NRs) and the SiO$_2$ layer adheres the InAs NRs to the target substrate as the stamp 15 is peeled away, as shown in FIG. 2F. The resulting InAs XOI substrate can be used to form high performance nanoscale transistors.

Figure 3:
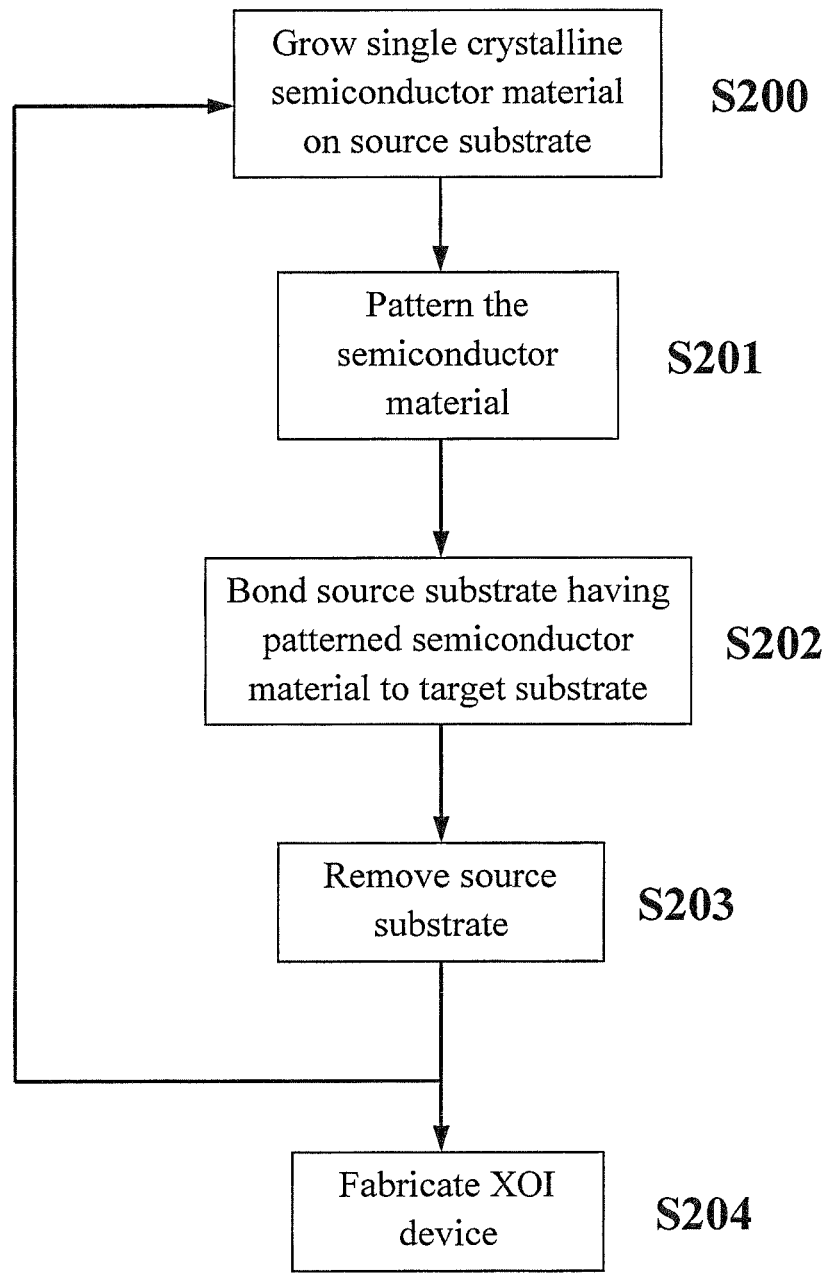
FIG. 3 shows a block diagram process flow of an XOI fabrication scheme in accordance with a second embodiment of the invention.

According to another embodiment of the invention, an epitaxial transfer process of the single crystal semiconductor material onto a target substrate is accomplished using a bonding method. Referring to FIG. 3, for the epitaxial transfer process using a bonding method, single crystal semiconductor material is grown to a predetermined thickness on a source substrate (S200). The source substrate includes a base material (or handle substrate) and a sacrificial layer on the base material. A patterning process can be performed to affect the geometry and/or shape of the single crystal semiconductor material (S201). The patterning process can be carried out similarly to step S101 so description thereof will be omitted. Once the mask layer pattern used in the patterning process is removed, an optional thermal oxide (not shown) can be formed on the patterned semiconductor material.

Next, the source substrate having the patterned semiconductor material (and optional thermal oxide) is bonded to a target substrate (S202). For many XOI applications, the target substrate can be a Si/SiO$_2$ substrate. In certain embodiments, the bonding can be carried out by applying pressure to the target and source substrate at particular temperatures until the two substrates are bonded.

Then, the source substrate is removed, leaving the patterned semiconductor material on the target substrate (S203). In order to remove the source substrate from the target substrate, the sacrificial layer is etched. The etching of the sacrificial layer can be a wet etch where the patterned semiconductor material provides openings for the etchant to access the sacrificial layer during the etching process. The etchant for sacrificial layer etchant should have a high selectivity with the single crystal semiconductor material in order to inhibit etching of the single crystal semiconductor NRs (or other geometry) during the etching of the sacrificial layer.

The growth and transfer process (S200-S203) can be carried out multiple times to create superstructures having multiple patterned crystalline semiconductor layers. Once the growth and transfer process (S200-S203) is complete, an XOI device, such as an XOI FET can be fabricated on the target substrate having the transferred device layer thereon (S204).

FIGS. 4A-4F illustrate a bonding method transfer process that can be used to form an XOI substrate according to a specific embodiment of the invention. The process described with respect to FIGS. 4A-4F refers to an epitaxial transfer scheme for integrating ultrathin InAs layers with nanometer-scale thicknesses on Si/SiO$_2$ substrates (i.e., assembly of an InAs XOI substrate) for use as high performance nanoscale transistors. However, this process should not be construed as limited to the specific materials described herein. For example, other II-IV and III-V compound semiconductors can be used.

Referring to FIG. 4A, a single-crystalline InAs film 22a is grown on a source substrate comprising a GaSb substrate 20 with an AlGaSb sacrificial layer 21. The ratio of Al atoms to Ga atoms in the AlGaSb composition of the sacrificial layer can be adjusted. For example, an Al$_x$Ga$_{1-x}$Sb (0.2=x=1) sacrificial layer can be used. In certain embodiments, the single-crystalline InAs film 22a can be formed of In$_x$As$_y$Sb$_z$ where x and y are positive number and z is 0 or a positive number.

Referring to FIG. 4B, an etch mask pattern 23 can be formed on the single-crystalline InAs film 22a. In one embodiment, the etch mask pattern 23 is formed of PMMA. The PMMA etch mask 23 can be defined using lithography processes.

Referring to FIGS. 4C-4D, the epitaxially grown, single-crystalline InAs film 22a is wet etched using the etch mask pattern 23 as an etch mask to form NR arrays 22, and the etch mask pattern 23 is removed. Again, the initial epitaxial growth process can be used to control the thickness of the transferred InAs NRs, while the etch mask can be used to tune the length and width.

Referring to FIG. 4E, the source substrate having the InAs NRs is bonded to a Si/SiO$_2$ target substrate. The bonding can be carried out by applying pressure to the target and source substrate at particular temperatures until the two substrates are bonded. Though not shown, a thermal oxide can be optionally grown on the InAs NRs 22. The thermal oxide may be used to improve the bonding force between the source and target substrates and can act as a passivation layer. The thermal oxide can be grown before or during the bonding step.

Referring to FIG. 4F, the AlGaSb sacrificial layer 21 can be etched by performing a selective wet etch, thereby detaching the source substrate from the InAs NRs 22. The resulting InAs XOI substrate can be used to fowl high performance nanoscale transistors.

According to further embodiments of the invention, the same transfer methods can be used to provide single crystal semiconductor materials on a CMOS substrate after formation of an interlayer dielectric layer or a top dielectric layer. According to one such embodiment, CMOS devices can be fabricated using conventional silicon technology and single crystal semiconductor material devices can be formed on a dielectric layer on the CMOS devices, by following steps S100-S104 as described with respect to FIG. 1 or steps S200-S204 as described with respect to FIG. 3 (where the target substrate is the CMOS substrate having the dielectric layer).

In accordance with certain embodiments of the invention, a thermal oxide is grown on the single crystal semiconductor material and transferred onto the target substrate with the single crystal semiconductor material such that the thermal oxide is disposed between the semiconductor material and the target substrate. The thermal oxide can provide a high quality interface between the semiconductor material and a dielectric, such as the SiO$_2$ layer, on the target substrate. The thermal oxide can also be used to improve a bonding force between the source substrate and the target substrate when transferring the single crystal semiconductor material to the target substrate.

Referring again to FIG. 1, in a further embodiment using a stamping method epitaxial transfer process, after growing the single crystal semiconductor material to a predetermined thickness on a source substrate (S100), a capping layer such as shown in FIG. 17A can be formed on the single crystal semiconductor material (in step S100-A of FIG. 17A).

FIGS. 17A-17D illustrate a stamping method transfer process that can be used to form an XOI substrate according to a specific embodiment of the invention. The process described with respect to FIGS. 17A-17D refers to an epitaxial transfer scheme for integrating ultrathin InAs layers with nanometer-scale thicknesses on Si/SiO$_2$ substrates (i.e., assembly of an InAs XOI substrate) for use as high performance nanoscale transistors. However, this process should not be construed as limited to the specific materials described herein. For example, other II-IV and III-V compound semiconductors can be used and optional capping layers directed to the particularly selected semiconductors can be used.

The capping layer of certain embodiments of the invention is used to engineer the strain of the transferred single crystal semiconductor material. The material for the capping layer is selected for having a good interface with the semiconductor material and to retain a high stiffness under strain. In accordance with certain embodiments of the invention, the capping layer is used to inhibit the relaxation of strain in the semiconductor material during the fabrication process. According to one embodiment, the capping layer is formed of ZrO$_x$, which exhibits a large Young's modulus (130-250 GPa). In a specific embodiment, the ZrO$_x$ is used as the capping layer when the single crystal semiconductor material is InAs because ZrO$_x$ has a good interface with InAs. In another embodiment, the capping layer is formed of SiO$_x$.

Referring to FIG. 17A, a single-crystalline InAs film 172a is grown on source substrate, and a ZrO$_x$ capping layer 173 is formed on the single-crystalline InAs film 172a. According to one embodiment, the source substrate includes a GaSb substrate 170 with an AlGaSb sacrificial layer 171 as a platform. In certain embodiments, an Al$_x$Ga$_{1-x}$Sb (0.2=x=1) sacrificial layer can be used. The ratio of Al atoms to Ga atoms in the AlGaSb composition of the sacrificial layer can be adjusted. In certain embodiments, the single-crystalline InAs film 172a can be formed of In$_x$As$_y$Sb$_z$ where x and y are positive numbers and z is 0 or a positive number. The In$_x$As$_y$Sb$_z$ compound semiconductor can be grown to a thickness on the AlGaSb sacrificial layer for enabling full-depletion mode operation of a transistor formed therefrom. In a further embodiment, InAs capping layers can be formed on top and bottom surfaces of the In$_x$As$_y$Sb$_z$ compound semiconductor and the ZrO$_x$ capping layer formed on the InAs/In$_x$As$_y$Sb$_z$/InAs heterostructure.

The ZrO$_x$ capping layer 173 can be etched in a pattern corresponding to a predetermined InAs film pattern.

Once the capping layer is formed, the patterning process (S101) can be carried out to affect the geometry and/or shape of the single crystal semiconductor material, such as shown in FIG. 17B. In certain embodiments, the capping layer and the single crystal semiconductor material can be patterned using a same etch mask. In another embodiment, different etch masks can be used. As shown in FIG. 17B, the InAs film 172a can be etched to form the predetermined InAs pattern 172. One or both of the InAs and the ZrO$_x$ capping layer can be etched using an etch mask pattern formed of, for example, PMMA.

The remaining steps of the method described with respect to FIG. 1 can be carried out where the sacrificial layer is etched (S102) in order to facilitate the release (detachment) of the single crystal semiconductor NRs (or other geometry) from the source substrate, and then single crystal semiconductor NRs (or other geometry) are transferred to a target substrate using a stamp (S103). For example, as shown in FIG. 17C, the underlying AlGaSb sacrificial layer 171 can be selectively etched. This can be carried out by using, for example, a selective wet etch. An optional thermal oxide (not shown) can be formed on the patterned semiconductor material before transferring the patterned semiconductor material to the target substrate. To transfer the InAs patterns 172 to the target substrate, the InAs patterns 172 can be detached from the source substrate using a stamp 175. The stamp 175 can be an elastomeric polymer, such as an elastomeric PDMS slab. The stamp is preferably placed on the capping layer directly, but in certain embodiments adhesive layers may be used. The stamp can be placed directly on the capping layer to detach the partially released (from the etching of the sacrificial layer) patterned single crystal semiconductor from the source substrate. The stamp (having the detached patterned single crystal semiconductor and capping layer is then placed on the target substrate to transfer the patterned single crystal semiconductor and capping layer onto the target substrate.

As shown in FIG. 17D, the stamp 175 having the detached InAs patterns (or NRs) 172 and the optional ZrO$_x$ capping layer 173 is applied to a Si/SiO$_2$ target substrate, and the interaction between the InAs (or the optional thermal oxide on the InAs) and the SiO$_2$ layer adheres the InAs patterns 172 to the target substrate 176 as the stamp 175 is peeled away. The resulting InAs XOI substrate can be used to form high performance nanoscale transistors.

As previously described, for many XOI applications, the target substrate can be a Si/SiO$_2$ substrate. In certain XOI applications, the target substrate may have different base materials so long as a dielectric layer (or other material having a stronger interaction with the crystal semiconductor material than the material of the stamp) is provided for the single crystal semiconductor to be transferred onto.

The strain of the X layer in XOI can be tuned by choosing different cap layers (with different Young's moduli), cap thicknesses, and the initial stress inside the cap to obtain the optimal strain level for the desired device application. Such tuning adds yet another degree of versatility to the use of epitaxial layer transfer technique of ultrathin semiconductors for device applications.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

Example

Semiconductor Growth on Source Substrate

For the experiments described with respect to FIGS. 5-16, single-crystalline InAs thin films (10-100 nm thick) were grown epitaxially on a 60 nm thick Al$_{0.2}$Ga$_{0.8}$Sb layer on bulk GaSb substrates (see S100 and FIG. 2A). The preparation of the GaSb/Al$_{0.2}$Ga$_{0.8}$Sb/InAs source wafers used for the epitaxial transfer process began with growing the source layers in a solid source VG-80 molecular beam epitaxy (MBE) reactor on n-type (Te-doped, $5 \times 10^{17}$ cm$^{-3}$) epi-ready GaSb (001) double-side polished substrates using As$_2$ and Sb$_2$ valved cracker sources. Indium and gallium growth rates were determined by monitoring the intensity oscillations in the reflected high-energy electron diffraction (RHEED) patterns and set to 0.35 mL/s for Ga, 0.30 mL/s for In and 0.43 mL/s for AlGaSb. Group-V fluxes were adjusted using a conventional ion gauge to satisfy a group V/III beam equivalent pressure (BEP) flux ratio equal to 3.6 for GaSb and 9 for InAs. Initially, the substrate was outgassed under a vacuum, and then the surface oxide was removed at high temperature (535° C.) under an Sb flux. The GaSb and Al$_{0.2}$Ga$_{0.8}$Sb layers of the structure were grown at 490° C. whereas the InAs layer was grown at 410° C. Cross-sectional TEM images of an as-grown source sample is shown FIGS. 5A and 5B. The cross-sectional TEM image shown in FIG. 5A shows a 15 nm thick InAs thin film grown epitaxially on an approximately 60 nm thick Al$_{0.2}$Ga$_{0.8}$Sb layer on a bulk GaSb wafer. The HRTEM shown in FIG. 5B shows the single-crystalline structure of the InAs thin film on AlGaSb, with the inset showing the corresponding diffraction pattern indicating the [110] zone.

Example

Patterning of Semiconductor on Source Substrate

Polymethylmethacrylate (PMMA) patterns with a pitch and line-width of ~840 nm and ~350 nm respectively were lithographically patterned on the surface of the source substrate (see S101 and FIG. 2A). The InAs layer was then pattern etched into nanoribbons (NRs) (see S101 and FIG. 2B) by using a mixture of citric acid (1 g/ml of water) and hydrogen peroxide (30%) at 1:20 volume ratio, which was chosen for its high selectivity and low resulting InAs edge roughness.

Example

Sacrificial Layer Etch

To release the InAs NRs from the source substrate after the etching of InAs film into NRs, the underlying Al$_{0.2}$Ga$_{0.8}$Sb layer was selectively etched. The Al$_{0.2}$Ga$_{0.8}$Sb layer was selectively etched by ammonium hydroxide, NH$_4$OH, (3%, in water) solution for 110 min (see S102 and FIGS. 2D and 6A). As shown in FIGS. 6B-6E, the selective etching of the AlGaSb layer was high enough not to affect the nanoscale structure of the InAs NRs. FIG. 6B shows an SEM image of the InAs NRs on the source substrate before the NH$_4$OH etch. FIG. 6C shows an SEM image of the InAs NRs on the source substrate after etching by NH$_4$OH for 10 min. FIG. 6D shows an SEM image of the InAs NRs on the source substrate after etching by NH$_4$OH for 30 min. FIG. 6E shows an SEM image of the InAs NRs on the source substrate after etching by NH$_4$OH for 50 min.

Example

Stamp Transfer Process

An elastomeric polydimethylsiloxane (PDMS) substrate (~2 mm thick) was used to detach the partially released InAs NRs from the GaSb donor substrates and transfer them onto Si/SiO$_2$ (50 nm, thermally grown) receiver substrates by a stamping process (see FIGS. 2E and 2F). The transfer using a PDMS stamp can be carried out as taught by Meitl, M. A. et al. in "Transfer printing by kinetic control of adhesion to an elastomeric stamp," (*Nature Mater.* 5, 33-38 (2006)), which is hereby incorporated by reference in its entirety.

Example

Surface Morphology for Stamp Transferred InAs NRs

Figure 7A:
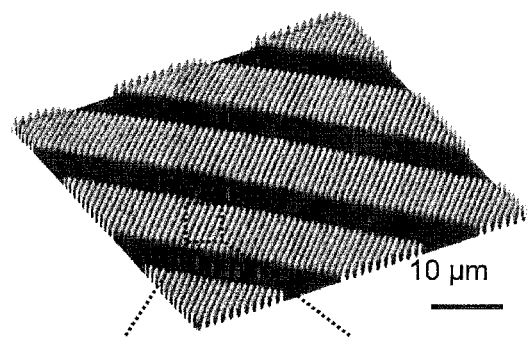
FIGS. 7A-7D show atomic force microscopy (AFM) images of InAs nanoribbon (NR) arrays on a $Si/SiO_2$ substrate fabricated in accordance with an embodiment of the invention.
Figure 7B:
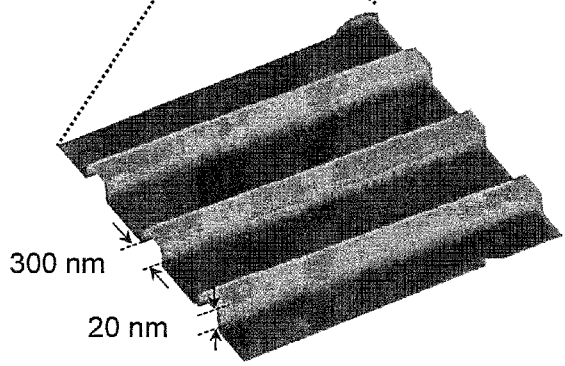
Figure 7C:
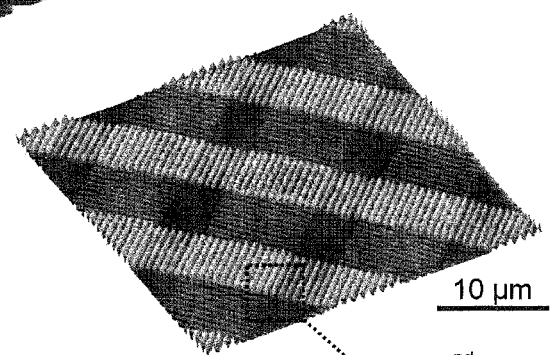
Figure 7D:
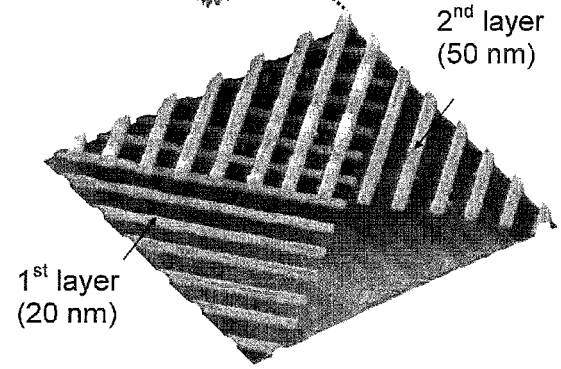

Atomic force microscopy (AFM) was utilized to characterize the surface morphology and uniformity of the fabricated XOI substrates. FIGS. 7A and 7B show representative AFM images of an array of InAs NRs (~20 nm thick, length of ~10 μm, and width of ~300 nm) on a Si/SiO$_2$ substrate, clearly depicting the smooth surfaces (<1 nm surface roughness) and high uniformity of the enabled structures over large areas.

As previously mentioned, the subject transfer processes readily enable the heterogeneous integration of different III-V materials and structures on a single substrate through a multi-step epitaxial transfer process in accordance with embodiments of the invention. To demonstrate this capability, a two-step transfer process (corresponding to performing steps S100-S103 twice) was utilized to form ordered arrays of 18 and 48 nm thick InAs NRs that are perpendicularly oriented on the surface of a Si/SiO$_2$ substrate, as shown in the AFM images of FIGS. 7C and 7D). Accordingly, XOI technology can be used for generic heterogeneous and/or hierarchical assembly of crystalline semiconducting materials.

Example

Interface Structure for InAs XOI Device

Figure 8A:
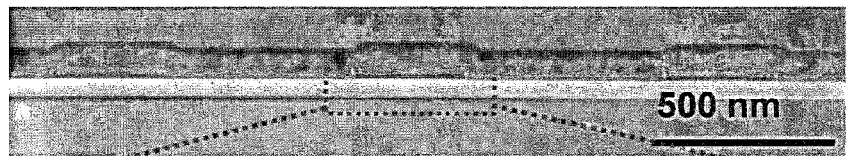
Figure 8B:
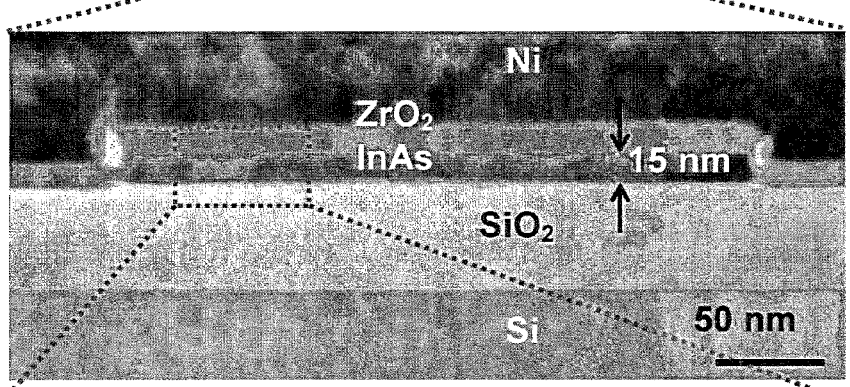
Figure 8C:
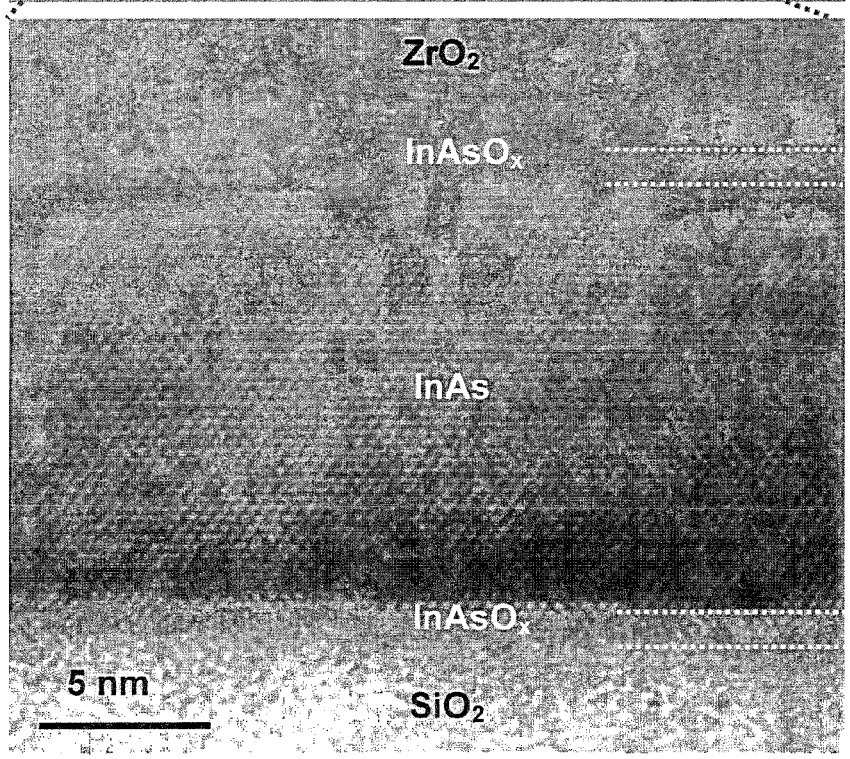

The atomic structure of the interfaces for an InAs XOI device can be seen in the cross-sectional TEM images shown in FIGS. 8A-8C. FIG. 8A shows a TEM image of an array of three InAs NRs on a Si/SiO$_2$ (~50 nm thick) substrate. The NRs are coated with a ZrO$_2$/Ni bilayer (~15 and ~50 nm, respectively) which acts as a top-gate stack for the subsequently fabricated FETs. FIG. 8B shows a magnified TEM image of an individual InAs NR on the Si/SiO$_2$ substrate; and FIG. 8C shows a HRTEM image of the single-crystalline structure of an InAs NR with abrupt atomic interfaces with ZrO$_2$ and SiO$_2$ layers on the top and bottom surfaces, respectively.

The HRTEM image of FIG. 8C illustrates the single-crystalline structure of InAs NRs (~13 nm thick) with atomically abrupt interfaces with the SiO$_2$ and ZrO$_2$ layers. Notably, the InAs/SiO$_2$ interface does not exhibit any visible voids in the image, demonstrating the conformal bonding between the layers. The InAs NRs were thermally oxidized prior to the top-gate stack deposition to drastically lower the interfacial trap densities. The thermally grown InAsO$_x$ layer is clearly evident in the HRTEM image with a thickness of ~1 nm.

Example

Long-Channel, Back-Gated FETs Device Structure
(see FIG. 12B)

Long-channel, back-gated FETs based on individual NRs were fabricated in order to elucidate the intrinsic electron transport properties of InAs NRs as a function of thickness. The process scheme involved the fabrication of XOI substrates with the desired InAs thickness followed by the formation of source/drain (S/D) metal contacts by lithography and lift-off (~50 nm thick Ni). The p$^+$ Si support substrate was used as the global back-gate with a 50 nm thermal SiO$_2$ as the gate dielectric. Ni contacts were annealed at 225° C. for 5 min in a N$_2$ ambient to enable ohmic metal contact formation to the conduction band of InAs. Each FET of the experiment and simulation consists of a single NR.

Example

Long-Channel, Back-Gated FETs Transfer Characteristics

Figure 9A:
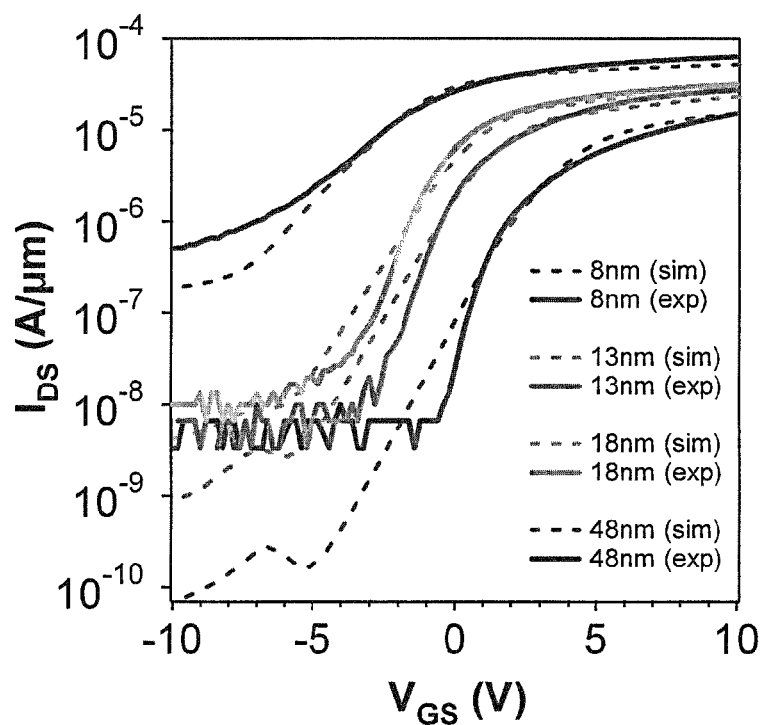
FIG. 9A shows I-V characteristics of simulated (solid lines) and experimental (dashed lines) back-gated, long channel InAs XOI FETs in accordance with embodiments of the invention for different InAs NR thicknesses.
Figure 9B:
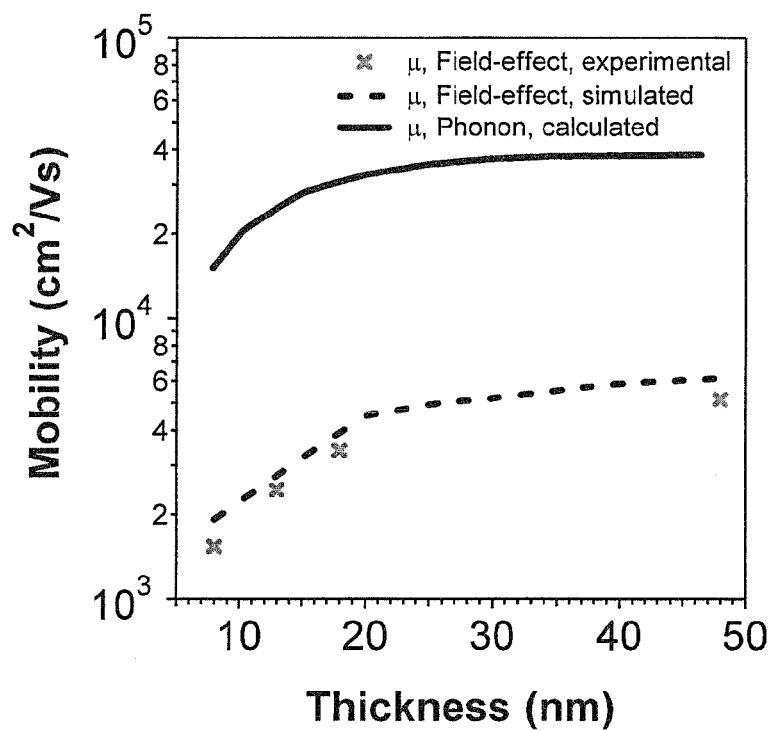
FIG. 9B shows a plot of peak field-effect electron mobilities of simulated and experimental InAs NRs in accordance with embodiments of the invention as a function of NR thickness.

The transfer characteristics at $V_{DS}$=0.1V of the back-gated XOI FETs with a channel length, L~5 μm and InAs thicknesses of 8 nm, 13 nm, 18 nm, and 48 nm are shown in FIG. 9A. The experimental characteristics are shown as solid lines and the simulated characteristics are shown as dashed lines. FIG. 9B shows the calculated phonon mobility and the experimental and simulated peak field-effect electron mobilities of InAs NRs as a function of NR thickness.

Two trends are clearly evident from the measurements. First, the OFF current monotonically degrades with increasing thickness due to the reduced electrostatic gate coupling of the back-gate. Second, the ON current increases with InAs thickness due to the thickness dependency of electron mobility, μ$_n$. Since L~5 μm, the devices are effectively operating in the diffusive regime, thereby enabling the direct extraction of the field-effect mobility by using the relation $\mu_{n,FE}=(g_m)(L^2/C_{ox}V_{DS})$, where $g_m$=$dI_{DS}/dV_{GS}|_{V_{DS}}$ is the transconductance and $C_{ox}$ is the gate oxide capacitance.

For this analysis, parasitic resistances were ignored since Ni forms near ohmic metal contacts. The gate oxide capacitance was estimated from the parallel plate capacitor model $C_{ox}$=($\in$A)/d, where $\in$=3.9 and d=50 nm are the dielectric constant and thickness of SiO$_2$, respectively. The effect of quantum capacitance, $C_Q$ was neglected due to the relatively thick gate dielectrics used in this study (i.e., $C_{ox} \ll C_Q$).

Example

Long-Channel, Back-Gated FETs Mobility Characteristics as a Function of InAs Thickness FIG. 9B shows the peak μ$_{n,FE}$ as a function of InAs thickness, T$_{InAs}$. The mobility at first linearly increases with thickness for T$_{InAs}$<~18 nm with a slope of ~221 (cm$^2$/Vs)/nm, beyond which it nearly saturates at μ$_{n,FE}$~5,500 cm$^2$/Vs.

To shed light on the observed mobility trend, the low-field phonon mobility, μ$_{n,phonon}$ was calculated as $$\mu_{n,phonon} = e \Big/ \left( m^* \left\langle \frac{1}{\tau} \right\rangle \right),$$

where e is the electronic charge and m* is the effective mass (see section entitled "Calculation of Phonon Mobility of InAs NRs").

As explained in the section entitled "Calculation of Phonon Mobility of InAs NRs," the average scattering rate <1/t> is calculated from $$\left\langle \frac{1}{\tau} \right\rangle = \frac{\int \frac{1}{\tau(E)} \frac{\partial f_0}{\partial E} dE}{\int \frac{\partial f_0}{\partial E} dE}$$

where $f_0$ is the equilibrium Fermi-Dirac distribution function. t(E) was calculated using Fermi's golden rule, with the matrix elements of the scattering potentials evaluated in the basis of the NR eigenfunctions. Both acoustic and optical (including polar) phonon scattering events were considered. The calculated μ$_{n,phonon}$ vs. T$_{InAs}$ is shown in FIG. 9B. For small thicknesses, the mobility linearly increases with the thickness. This behavior is attributed to the gradual transition of the channel from a 2D to 3D system as the NR thickness is increased, with more transport modes (i.e., sub-bands) contributing to the current flow. As the thickness surpasses the Bohr radius of bulk InAs (~34 nm), the electronic structure of NRs approaches the 3D regime, resulting in a mobility saturation for T$_{InAs}$>~35 nm to the well-known bulk value of InAs (~40,000 cm$^2$/Vs). While the onset thickness of saturation closely matches the experiments, there is 5-10× discrepancy in the actual mobility values. This is expected since the extracted data represents the field-effect mobility, consisting of phonon scattering along with other device contributions, including interface trap states, surface roughness scattering, and vertical-field-induced mobility degradation.

Calculation of Phonon Mobility of InAs NRs

This section outlines the calculation of low-field mobility of InAs NRs by considering various phonon scattering mechanisms. As the NRs are not intentionally doped, an electron concentration n~10$^{15}$ cm$^{-3}$ arising due to unintentional doping is assumed. The density of states of NRs can be approximated by $$\frac{m^*}{\pi \hbar^2 T_{InAs}},$$

where $T_{InAs}$ is the NR thickness. Since this density of states is much larger than n, it is reasonable to assume that the equilibrium Fermi energy $E_F$ lies within the bandgap for all values of $T_{InAs}$. Hence, the peak mobility measured in experiments corresponds to the maximum transconductance $g_m$, which occurs when $E_F$ coincides with the first conduction sub-band in the channel. The contribution of acoustic and optical phonons along with polar optical phonons—the dominant source of scattering in polar semiconductors such as InAs—is considered. The scattering rate due to acoustic and optical phonons is summed over longitudinal and transverse modes. The energy dependent scattering rate is averaged over the range of a few $k_B T$ around $E_F$.

$$\left\langle \frac{1}{\tau} \right\rangle = \frac{\int \frac{1}{\tau(E)} \frac{\partial f_0}{\partial E} dE}{\int \frac{\partial f_0}{\partial E} dE}$$

Here $$\left\langle \frac{1}{\tau} \right\rangle$$

is the average scattering rate, $$\frac{1}{\tau(E)}$$

the total scattering rate of an electron with an energy E due to all scattering mechanisms and $f_0$ the equilibrium Fermi-Dirac distribution function. The low-field NR phonon mobility $\mu_{n,phonon}$ is then calculated as $$\mu_{n,phonon} = \frac{e}{m^* \left\langle \frac{1}{\tau} \right\rangle},$$

where e is the electronic charge and m* is the effective mass. An 8×8 Kane's second order k.p Hamiltonian is used to model the quantum confinement effects, such as the change in the bandgap, effective mass, etc. in the dispersion relation of InAs NRs. Two approximations are used for the calculations—i) Consideration of the effect of 3D phonons alone which is motivated by the fact that the elastic constants of the NRs are similar to that of the bulk and ii) ignoring of interband scattering for simplicity.

The rate for each of the scattering mechanisms is calculated using the Fermi's golden rule wherein the matrix elements of each of the scattering potentials are evaluated on the basis of eigenfunctions of the NR.

The scattering rate due to acoustic phonons in a NR of width $T_{InAs}$ is given by:

$$\frac{1}{\tau_{ac}(E)} = \sum_{p=LA,TA1,TA2} \frac{3\pi D_A^2 k_B T}{2 h C_p T_{InAs}} g_{2D}(E)$$

where $$g_{2D}(E) = \frac{m^*}{\pi \hbar^2} \sum_n \Theta(E - E_n)$$

$$E_n = \frac{\hbar^2}{2m^*_{conf}} \left( \frac{n\pi}{T_{InAs}} \right)^2, n = 1, 2, 3 \ldots n_{max}.$$

Here, $$\frac{1}{\tau_{ac}(E)}$$

is the acoustic phonon scattering rate, $D_A$ is the electron intravalley acoustic deformation potential, $C_p$ is the elastic constant corresponding to mode p, related to velocity of sound in that mode $v_{s,p}$ by $$v_{s,p} = \sqrt{\frac{C_p}{\rho}},$$

$\rho$ being the density of InAs, $g_{2D}(E)$ the 2D density of states in the NR, $\Theta(.)$ is the unit step function, m* is the effective mass in the direction of confinement and $$n_{max} = \frac{T_{InAs}}{a_0},$$

$a_0$ being the lattice constant of InAs. The values of $D_A$ and $v_{s,p}$ were obtained from the reported values respectively disclosed by Van de Walle in "Band lineups and deformation potentials in the model-solid theory," (*Phys. Rev. B* Vol. 39, 1871-1883 (1989)) and Adachi in "Indium arsenide (InAs) *Handbook on Physical Properties of Semiconductors*," (Kluwer Academic Publishers, 2004), which are hereby incorporated by reference in their entirety.

Similarly, the scattering rate due to optical phonons is given by:

$$\frac{1}{\tau_{op}(E)} = \sum_{p=LO,TO} \frac{3\pi D_0^2}{4\rho \omega_p W_{rib}} g_{2D}(E \pm \hbar \omega_p) \left( N_0 + \frac{1}{2} \mp \frac{1}{2} \right)$$

where $$N_0 = \frac{1}{\exp\left(\frac{\hbar \omega_p}{k_B T}\right) - 1}.$$

Here, $$\frac{1}{\tau_{op}(E)}$$

is the scattering rate due to optical phonons, $D_0$ the electron optical deformation potential, $\omega_p$ the optical phonon frequency of mode p. The top sign corresponds to phonon absorption and bottom one to phonon emission. The values for $\omega_p$ and $d_0$ ($=D_0 a_0$) were respectively obtained from Groenen et al. in "Strain distribution and optical phonons in InP/InAs self-assembled quantum dots (*Phys. Rev. B*, Vol. 60, 16013-16017 (1999)) and Pötz et al. in "Theory of optical-phonon deformation potentials in tetrahedral semiconductors" (*Phys. Rev. B*, Vol. 24, 2025-2037 (1981)), which are hereby incorporated by reference in their entirety. The scattering rate due to polar optical phonons is given by:

$$\frac{1}{\tau_{pop}(E)} = \frac{e^2 \omega_{LO}\left(\frac{\kappa_0}{\kappa_\infty}-1\right)}{2\pi\kappa_0\varepsilon_0\hbar\sqrt{2E/m^*}}\left[N_0\sinh^{-1}\left(\frac{E}{\hbar\omega_{LO}}\right)^{1/2} + (N_0+1)\sinh^{-1}\left(\frac{E}{\hbar\omega_{LO}}-1\right)^{1/2}\right]$$

where $$\frac{1}{\tau_{pop}(E)}$$

is the polar optical phonon scattering rate, $\omega_{LO}$ is the longitudinal optical phonon frequency, $\kappa_0$ and $\kappa_\infty$ are the static and high frequency permitivities respectively. It must be noted that the polar optical phonon scattering rate, owing to the nature of the scattering potential, does not depend explicitly on $T_{InAs}$ unlike the other two scattering mechanisms and the dependence comes through $m^*$.

The calculated phonon mobility vs. thickness is shown in FIG. 9B by the solid curve. For small thicknesses the mobility increases almost linearly with thickness. This is due to the fact that with increasing thickness more modes start to creep into the energy window that contributes to the current flow. As the thickness increases, the additional increase in the number of modes starts to saturate and beyond a threshold point, the mobility saturates to the well known bulk value of InAs.

From the measured field-effect and calculated phonon mobilities as a function of $T_{InAs}$, the following observations can be made. First, the calculated value of $\mu_{n,phonon}$ for large values of $T_{InAs}$ (i.e., ~50 nm) is close to the bulk Hall mobility of InAs reported in the literature thus ascertaining that all the dominant scattering mechanisms are considered. Second, the drop in the measured value of field-effect mobility with thickness miniaturization, which signals the onset of confinement effects, occurs for $T_{InAs}$=30-40 nm. This critical thickness which is consistent with the experimental result is close to the Bohr radius of bulk InAs (~34 nm). Notably, the thickness where the system transitions from 3D to 2D depends strongly on $m^*$. A quantitative agreement with experiments in this regard further validates the $m^*$ values calculated from InAs NR dispersion relations. It should be noted that in all the calculations, NRs are effectively treated as thin films, since the widths are large enough (>~300 nm) not to cause confinement effects along the width of the NRs. Only the thickness affects the electronic properties.

Figure 10:
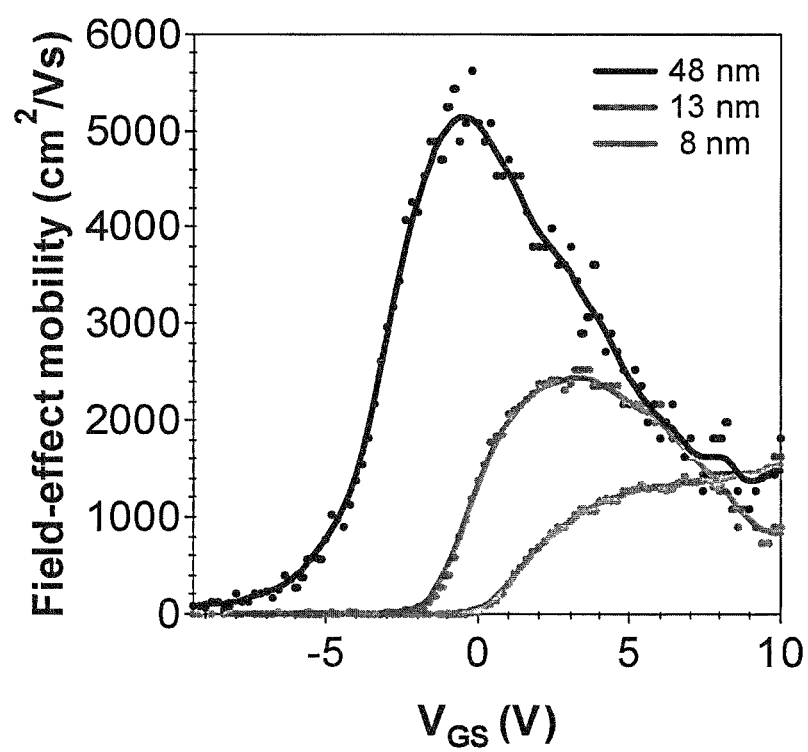
FIG. 10 shows plots of low-field, field-effect mobility of back-gated InAs XOI FETs according to an embodiment of the invention as a function of $V_{GS}$ at $V_{DS}=0.1$ V for InAs NR thickness of 8 nm, 13 nm, and 48 nm. The field-effect mobility is extracted from the measured $I_{DS}$-$V_{GS}$ curves at $V_{DS}=0.1$ V shown in FIG. 9A.

Field-Effect Mobility of Long-Channel, Back-Gated XOI FETs Based on Individual InAs NRs The transconductance ($g_m$=$dI_{DS}/dV_{GS|VDS}$) as a function of $V_{GS}$ for back-gated InAs XOI FETs, consisting of individual NRs, was first obtained from the measured transfer characteristics at $V_{DS}$=0.1V shown in FIG. 9A. The field-effect electron mobility was then estimated from the relation $\mu_{n,FE}$=$(g_m)(L^2/C_{ox}V_{DS})$, where L is the channel length and $C_{ox}$ is the gate oxide capacitance. FIG. 10 shows plots of low-field, field-effect mobility of back-gated InAs XOI FETs according to an embodiment of the invention as a function of $V_{GS}$ at $V_{DS}$=0.1 V for InAs NR thickness of 8 nm, 13 nm, and 48 nm.

The peak field-effect mobility increases with the thickness of InAs as depicted in FIG. 9B. It is also evident from the $\mu_{n,FE}$–$V_{GS}$ plots that the field-effect mobility increases with the gate voltage at first and then decreases at high gate voltages due to the enhanced surface scattering of electrons at high electric fields, similar to the conventional MOSFETs.

Device Simulation of InAs XOI FETs

To simulate $\mu_{n,FE}$, a full device simulation was performed. An interface trap density, $D_{it}$=6×10$^{12}$ states cm$^{-2}$ eV$^{-1}$ was used as the fitting parameter.

The simulated I-V characteristics of XOI back-gated FETs are shown in FIG. 9A. Clearly, the simulated I-V curves match the experimental data closely for all InAs thicknesses, especially in the ON-state. Note that the measured OFF current for the 8 nm, 13 nm, and 18 nm thick InAs FETs saturates at ~5 nA/μm which is limited by the resolution of the measurement set-up. Next, peak $\mu_{n,FE}$ was extracted from simulation and plotted as a function of $T_{InAs}$ (FIG. 9B), once again closely matching the experimental $\mu_{n,FE}$. The close matching of the experimental and simulated results demonstrate the effectiveness of the XOI platform as a clean and predictable material system for exploring high performance devices while highlighting the critical role of quantum confinement on the transport properties of InAs, even at relatively large thicknesses.

The two dimensional simulations were carried out by self consistently solving Poisson's Equation, the electron and hole drift diffusion equations using TCAD Sentaurus 2009. Both top-gated and back-gated device structures were simulated. The back-gated FET consisted of a p-Si substrate with $N_A$=10$^{21}$ cm$^{-3}$ used as the global gate with 50 nm of SiO$_2$ (e=3.9) gate dielectric. A 2 nm thick indium oxide layer (e=3.4) was assumed on the top and bottom surfaces. The channel length was assumed 5 μm, and the InAs thickness was varied from 5-50 nm. The InAs NR was assumed n-type with $N_D$=4×10$^{16}$ cm$^{-3}$. This value was chosen to best match the experimental ON current for the devices. In addition, thin regions of heavily doped InAs were inserted between the contacts and the channel to minimize contact effects on the simulated data. Interface traps were placed at the InAs/Indium Oxide interfaces on both the top and bottom surfaces of NRs. The interface trap density was used as a fitting parameter with $D_{it}$=6×10$^{12}$ states eV$^{-1}$-cm$^{-2}$, which was found to fit the experimental results the best for all NR thicknesses. In addition, field-dependent mobility and velocity saturation models were both considered. A one band effective mass model was used which ignores the effect of quantum confinement on the density of states. In the future, a more accurate device simulation that incorporates the density of states as a function of quantization and InAs thickness is needed. For each NR thickness, the calculated phonon mobility, confined bandgap, and confined effective mass were used as input parameters. Due to the weak gate coupling to the channel (arising from the back-gate geometry) and the high $D_{it}$, the current in the $V_{GS}$=−0.5V to 0.5V region is not properly handled by Sentaurus. In order to provide for a smooth transition between the subthreshold and accumulation regimes, the simulated $I_{DS}$-$V_{GS}$ curves were fit to an error function, with the points mentioned above removed. This allowed for a more accurate fitting for the region between the subthreshold and ON-state regimes. The threshold voltage of each simulated curve was shifted to match that of the corresponding experimental device. After fitting, the field-effect mobility was deduced as a function of the gate voltage from the simulated I-V characteristics by using the analytical expression described previously. The peak mobility was then extracted for each InAs thickness and plotted in FIG. 9B.

Similarly, the top-gated XOI FETs were simulated with 2 nm of indium oxide assumed on the two surfaces of InAs with a body doping concentration of $N_D=4\times10^{16}$ cm$^{-3}$. The top gate stack was composed of 7 nm of $ZrO_2$ (e=20) and a metal gate electrode with a workfunction of 5 eV. The source and drain contacts were assumed ohmic. To fit the subthreshold swing of the experimental devices, the trap density at the InAs/InAsO$_x$ interfaces was chosen to be $D_{it}=10^{11}$ states eV$^{-1}$-cm$^{-2}$. Notably, this extracted $D_{it}$ is ~60× lower than that of the back-gated. FETs as the former consists of thermally grown InAsO$_x$ passivation layer while the latter consists of a native oxide layer. To fit the linear region, the series resistance at the source and drain ($R_s$, $R_d$) were chosen to be 100 Ω·μm (unit width normalized), arising from the un-gated regions near the S/D electrodes. The threshold voltage was shifted to match that of the corresponding experimental device. The simulation results for an InAs XOI FET having an InAs layer thickness of ~18 nm are shown in FIGS. 11A-11B, clearly depicting the close match between the experiment and simulation, further demonstrating the near ideal material and device system presented in this work with deterministic electrical properties.

Example

Performance Characteristics of InAs XOI FETs (XOI vs. Bulk InAs FETs)

This section discusses performance advantages of InAs XOI FETs as compared to their bulk counterparts. FIG. 12A shows schematic illustrations of an InAs bulk MOSFET (top) and an InAs XOI MOSFET (bottom) according to an embodiment of the invention; FIGS. 12B and 12C show a device schematic and a representative SEM image, respectively, of a top-gated FET according to an embodiment of the invention; and FIGS. 12D and 12E show graphs of transfer characteristics (FIG. 12D) and output characteristics (FIG. 12E) of a top-gated InAs XOI FET according to an embodiment of the invention.

The transfer characteristics shown in FIG. 12D of a top-gated InAs XOI FET, are similar to that shown in FIG. 9A for the experimental results of the device having an individual NR (~18 nm thick) with L~0.5 μm and 8 nm thick $ZrO_2$ gate dielectric. Output characteristics of the same device are shown in FIG. 12E. For these devices, the NRs were thermally oxidized at 350° C. for 1 min to form ~1 nm thick interfacial InAsOx layer for surface passivation of InAs.

The dashed lines in FIG. 12A illustrate the S/D junctions for each device, depicting the drastically reduced parasitic junction area in the XOI design of an embodiment of the invention. The reduced parasitic junction area aids in achieving low leakage (i.e., OFF) currents.

For narrow bandgap semiconductors, the significant junction leakage can cause unacceptably high OFF currents for bulk MOSFET devices. This presents a challenge as most semiconductors with high mobilities and carrier saturation velocities, such as InAs, exhibit small bandgaps (e.g., $E_g$~0.36 eV for InAs). As compared to the bulk devices, XOI FETs exhibit greatly reduced leakage currents due to (i) significantly reduced junction areas, and (ii) the elimination of the junction leakage path due to the lack of a direct body contact.

To quantify the effect of these features, full device simulations for bulk and XOI $T_{InAs}$=10 nm) InAs MOSFETs were performed. Device simulations on two N$^+$/P/N$^+$ structures were performed: (i) a bulk InAs n-MOSFET, and (ii) an XOI n-MOSFET. The structure of each device is shown in FIGS. 13A and 13B. Briefly, the P-InAs body has $10^{16}$ cm$^{-3}$ acceptors and the N$^+$ source (S) and drain (D) contacts are doped with $10^{19}$ cm$^{-3}$ donors. The thickness of the InAs layer for the XOI FET is 10 nm while a 10 nm junction depth for S/D is assumed for the bulk MOSFET. The metal gate workfunction was assumed to be 5 eV. A 7 nm $ZrO_2$ thin film with a 1 nm $InO_2$ interfacial layer were used as the gate dielectric. Channel length for both devices is 0.5 μm with a S/D length of 100 nm. The I-V behavior was simulated for both devices using the same methodology as the previous simulations. In order to evaluate solely the effect of the junction area and elimination of the leakage path, all the materials parameters of InAs were taken to be that of bulk InAs for both devices.

Figure 13C:
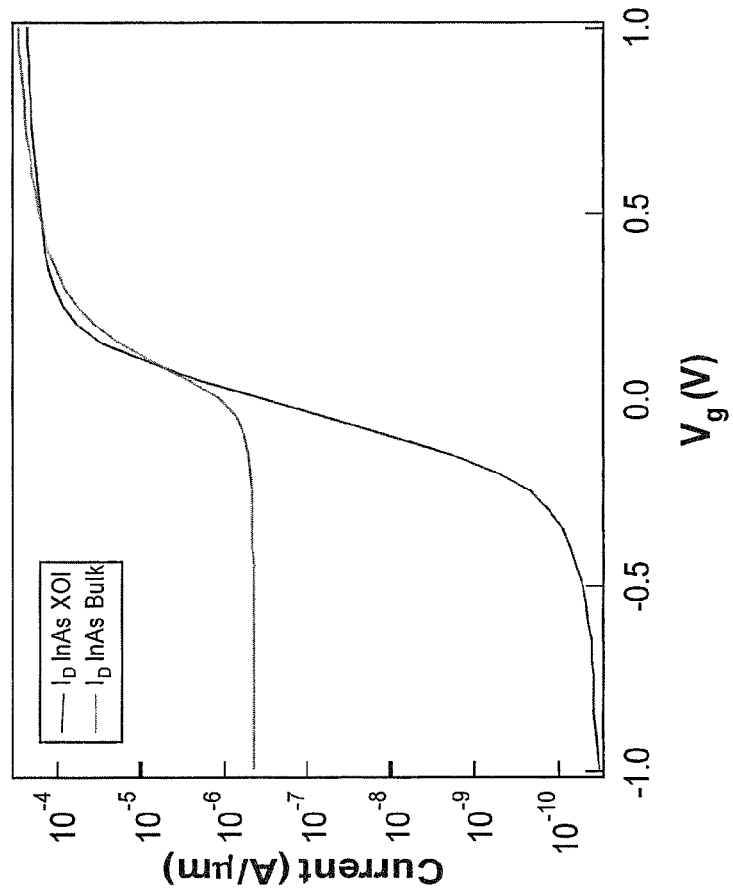
FIG. 13C shows a graph of simulated transfer characteristics at $V_{DS}=0.1V$ of the devices of FIGS. 13A and 13B, showing the drastic improvement in $I_{OFF}$ for the XOI device architecture of an embodiment of the invention.
Figure 13A:
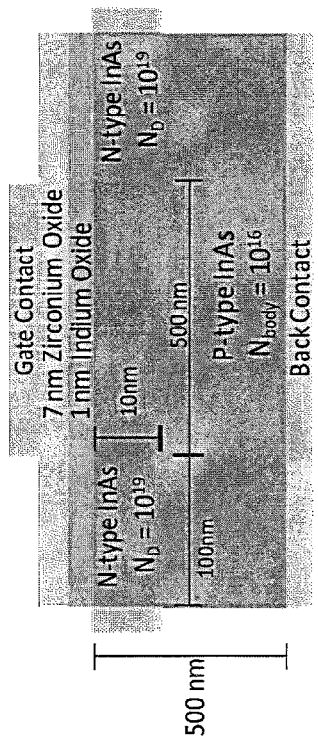
FIGS. 13A and 13B show device schematics of simulated structures for a bulk FET and an XOI FET according to an embodiment of the invention, respectively.
Figure 13B:
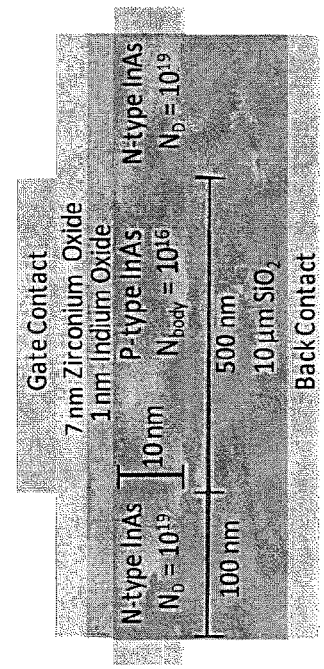

As shown in FIG. 13C, simulated I-V characteristics clearly depict the drastic improvement (~10$^4$×) in the OFF current for the XOI device architecture over the bulk transistor. Specifically, the OFF current improves by ~4 orders of magnitude, while the ON current is comparable.

This result demonstrates the value of the XOI device architecture for small band gap semiconductors, such as InAs. Accordingly, high performance FETs can be achieved with low OFF currents using narrow bandgap semiconductor XOI devices Electrical Properties of InAs XOI Top-Gated FETs as a Function of Surface/Interface Treatment In order to explore the performance limits of InAs XOI devices, top-gated FETs with high-κ gate dielectrics and L~0.5 μm were fabricated. Briefly, Ni S/D contacts were lithographically patterned on InAs NRs followed by the atomic layer deposition of ~8 nm thick $ZrO_2$ (e~20) as the gate dielectric. A local top-gate (Ni, 50 nm thick), underlapping the S/D electrodes by ~100 nm was then lithographically patterned.

Figure 14:
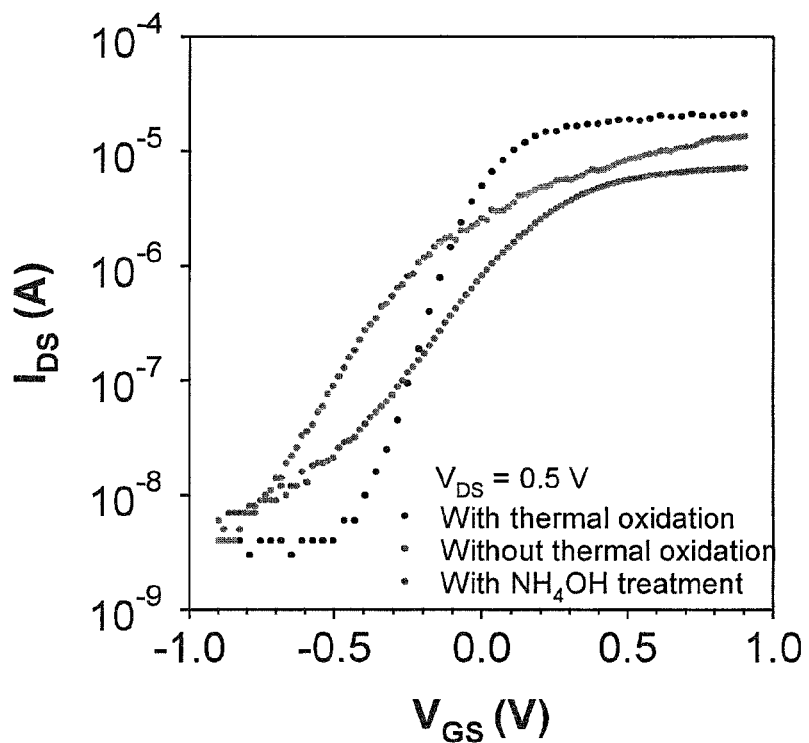
FIG. 14 shows a plot of transfer characteristics of three InAs XOI top-gated FETs according to embodiments of the invention with different surface treatment prior to atomic layer deposition (ALD) of a $ZrO_2$ gate dielectric.

Thermal oxidation of InAs was found to significantly improve the interfacial properties and FET characteristics. As shown in FIG. 14, transfer characteristics of three InAs XOI top-gated FETs with different surface treatment prior to the ALD of the $ZrO_2$ gate dielectric are shown. The three surface treatments are (i) a thermal oxidation of InAs at 350° C. for 1 min (resulting in ~1 nm thermal InAsO$_x$) prior to the ALD, (ii) no surface treatment (i.e., consisting of ~1 nm native surface oxide layer) before ALD, and (iii) NH$_4$OH immediately prior to the ALD to remove the surface oxide layer. For the thermally oxidized sample, the native oxide was first removed by a treatment with 3% NH$_4$OH. The results clearly depict the drastic enhancement of the subthreshold characteristics due to the effective surface passivation role of the thermally grown InAsO$_x$ layer, resulting in enhanced electrostatic coupling of the gate electrode. The SS is 107 mV/decade, 290 mV/decade, and 230 mV/decade for devices (i)-(iii), respectively. The channel lengths are 2 μm, 5 μm, and 5 μm for devices (i)-(iii), respectively.

In this regard, prior to the S/D contact formation, the XOI substrates were first treated with 3% NH$_4$OH to remove the native oxide followed by the thermal oxidation at 350° C. for 1 min to form ~1 nm thick InAsO$_x$ layer as observed from TEM analysis (see FIG. 8C).

Figure 15:
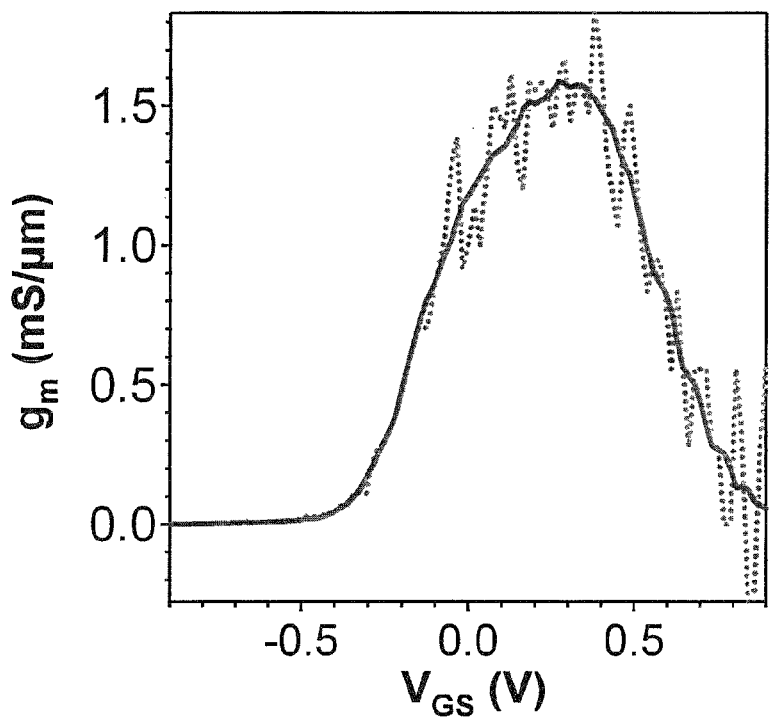
FIG. 15 shows a plot of transconductane $$g_m = \frac{dI_{DS}}{dV_{GS}}\bigg|_{V_{DS}}$$

FIG. 12D shows a typical $I_{ID}$-$V_{GS}$ characteristic of a top-gated FET, consisting of an individual ~48 nm thick InAs NR with a width of ~320 nm. The XOI FET exhibits a respectable $I_{ON}/I_{OFF}$~10$^4$ and a subthreshold swing of SS=$dV_{GS}$/d(log $I_{DS}$)~150 mV/decade (see FIG. 12E). In addition, as shown in FIG. 15, the XOI FET exhibits a peak $g_m$~1.6 mS/μm at $V_{DS}$=0.5V. The experimental transconductance $g_m$=$dI_{DS}$/$dV_{GS}|_{V_{DS}}$ as a function of gate bias at $V_{DS}$=0.5 as a function of $V_{GS}$ shown in FIG. 15 was obtained from the $I_{DS}$-$V_{GS}$ data shown in FIG. 12E. The dashed line represents the obtained transconductance after current differentiation while the solid line represents the transconductance after 2$^{nd}$ order Savitsky-Golay smoothing.

FIG. 16 shows the $I_{DS}$–$V_{GS}$ characteristics of a top-gated InAs XOI FET, consisting of an individual NR with ~18 nm thickness. The channel length is ~2 μm, gate dielectric ($ZrO_2$) thickness is ~6 nm deposited by ALD. The subthreshold swing SS is ~107 mV/dec.

As shown in FIG. 16, the lowest measured SS for our XOI FETs is ~107 mV/decade, which is close to the theoretical limit of ~60 mV/decade. This low SS is achieved despite the use of a relatively thick gate dielectric which can be further scaled in the future. The transistor output characteristic is shown in FIG. 12E, delivering an impressive $I_{ON}$~1.4 mA/μm at an operating voltage, $V_{DD}$=$V_{DS}$=$V_{GS}$=1V. Despite the relatively long channel length (~0.5 μm), the ON-current density and peak $g_m$ are among the highest reported for a planar III-V MOSFET. To further analyze the performance, a full device simulation was performed. A close match of the experimental data is obtained with $D_{it}$=$10^{11}$ states $cm^{-2}$ $eV^{-1}$ used as the fitting parameter (see description above with respect to FIGS. 11A and 11B), which is a ~60× improvement over devices without any surface treatment (i.e., with a native oxide layer). The fitted $D_{it}$ values represent only an approximate estimation. It should be noted that while C-V measurements are conventionally utilized for $D_{it}$ extraction in Si devices, doing so is rather challenging and prone to a large uncertainty for narrow bandgap semiconductors, such as InAs.

The thermal oxidation process described herein for surface passivation is counter-intuitive as previous works using compound semiconductors have focused on the removal of surface oxides. Unlike the native oxide layer, thermal oxidation results in the formation of a dense oxide with minimal dangling bonds. Similar to the thermally grown $SiO_2$, the thermal oxide of InAs provides an ideal and simple surface passivation layer, addressing one of the important challenges in InAs devices.

Example

Strain Engineering by Use of Capping Layer

For the strain engineering experiments, InAs XOI substrates were fabricated by epitaxially growing InAs thin films ($hI_{nAs}$=10-20 nm) on a 60 nm thick $Al_xGa_{1-x}Sb$ (x=0.2-1) sacrificial layer on GaSb (001) substrates. A $ZrO_x$ (or $SiO_x$) capping layer was deposited by electron-beam evaporation on top of the source wafer having the InAs thin films. The ultrathin InAs layers were lithographically patterned (width of 350 nm-5 μm) and wet etched using a mixture of citric acid [1 g/ml in de-ionized (DI) $H_2O$] and hydrogen peroxide (30%) at 1:20 volume ratio. Subsequently, the AlGaSb sacrificial layer was selectively etched in ammonium hydroxide (1.5%, in DI $H_2O$) solution. The partially released InAs micro- or nanoribbons were transferred onto Si/$SiO_2$ receiver substrates using an elastomeric polydimethylsiloxane substrate (~2 mm thick).

FIG. 18A illustrates an assumed strain for each layer of the GaSb/AlGaSb/InAs source wafer. The InAs and AlGaSb layers are coherently strained to the GaSb (001) substrate. FIG. 18B, which provides a high resolution x-ray diffraction (HRXRD) plot, confirms that the InAs and AlGaSb layers are coherently strained. Specifically, a O-2θ coupled scan, where O is the incident angle between the x-ray source and the sample and 2θ is the diffraction angle between the incident beam and diffraction beam, was used to resolve the (004) peaks from InAs, AlGaSb, and GaSb and extract the out-of-plane lattice parameters, $a_\perp$. FIG. 18B illustrates the diffraction spectra taken from GaSb/$Al_{0.2}Ga_{0.8}$Sb/InAs source wafers with $h_{InAs}$=10, 15, and 20 nm, referenced to the peak of GaSb substrate, which has a (004) Bragg angle at 30.3±0.1°.

The out-of-plane lattice parameters, $a_\perp$ were extracted by using Bragg's law 2d sin θ=nλ, where d is the distance between the (004) crystal plane (d=$a_\perp$/4), n=1, and λ is the x-ray wavelength (Cu's Kα). The $a_\perp$ of InAs was determined to be ~6.02 Å and the $a_\perp$ of $Al_{0.2}Ga_{0.8}$Sb was determined to be 6.11 Å. The bulk GaSb lattice parameter $a_{\perp,GaSb}$~6.10 Å. From the equation $a_\parallel$=$C_{11}$($a_0$–$a_\perp$/$2C_{12}$+$a_0$, where $C_{11}$ and $C_{12}$ are the elastic compliance constants and $a_0$ is the bulk lattice parameter ($a_{0,AlxGa1-xSb}$=(6.0959+0.0396x) Å, $a_{0,InAs}$=6.0584 Å), the in-plane lattice parameter $a_\parallel$ for both InAs and $Al_{0.2}Ga_{0.8}$Sb layers was found to be ~6.10 Å, which is the same as that of GaSb (001).

The experimental spectra also match the simulation data shown in FIG. 18B, which assume that both $Al_{0.2}Ga_{0.8}$Sb and InAs layers are biaxially strained such that their $a_\parallel$'s are the same as that of the GaSb substrate. The result is consistent with the fact that the thicknesses of the AlGaSb sacrificial layer and the InAs layer are within their theoretical critical thicknesses for heteroepitaxy of $h_c$~10.2 μm and 240 nm for $Al_{0.2}Ga_{0.8}$Sb and InAs, respectively, which can be calculated from the empirical equation hc=[A/(Δa/$a_0$)]$^n$, where A=16 and n=2.4 for III-V's, and Δa is the difference between $a_{0,AlxGa1-xSb}$ or $a_{0,InAs}$ and $a_{0,GaSb}$. The results are found to be generally true, regardless of the thickness of InAs and the Al content of the sacrificial layer used in this work. The amount of tensile strain inside the ultrathin InAs layer on the source wafers can be calculated by $e_0$=($a_{0,GaSb}$–$a_{0,InAs}$)/$a_{0,InAs}$~0.62%.

To visualize the strain state of the InAs layer in the XOI system (i.e., after transfer on Si/$SiO_2$ substrate), micro-Raman spectroscopy was employed and Lorentzian fitting was performed to extract the exact peak locations. Raman spectroscopy was not used for the analysis of the source wafer since InAs, AlGaSb, and GaSb have overlapping peaks. FIG. 19A shows the Raman spectra of InAs XOI ($h_{InAs}$=20 nm) obtained from source wafers with different composition of $Al_xGa_{1-x}$Sb sacrificial layers (x=0.2, 0.4, and 0.6) along with a plot indicating the known [001] bulk InAs data obtained from literature.

To illustrate the strain engineering provided by the subject capping layer, certain of the samples illustrating the strain state of the InAs layer in the XOI system were fabricated such that a capping layer was not used during the epitaxial transfer process.

For the InAs layer transferred without a capping layer, the spectra distinctly depict the first order transverse optic mode (~217 $cm^{-1}$), longitudinal optic (LO) mode (~239 $cm^{-1}$), and the low frequency branch of coupled LO-phonon-plasmon mode (L-) (~230-235 $cm^{-1}$) phonon peaks of InAs XOI. Clearly, as shown in FIG. 19A, InAs XOI layers obtained from sacrificial layers with different compositions exhibit near identical Raman spectra, with the LO peak position at ~239 $cm^{-1}$ which is the same as that for the InAs bulk substrate. Furthermore, as shown in FIG. 19B, the position of the LO peak is identical for InAs with thicknesses $h_{InAs}$=10-20 nm. The results suggest that in the absence of a $ZrO_x$ capping layer, the strain is fully released during the epitaxial transfer process. The release of the strain may occur upon the partial etch of the AlGaSb layer, which results in nearly free-standing InAs layers. However, as shown in FIG. 19C, the L-peak, which is due to the surface plasmon-LO phonon coupling, exhibits a $h_{InAs}$ dependence. One possible reason for the increasing L-/LO intensity ratio with reducing InAs thickness is due to the enhancement of the surface area to volume ratio. For all measurements, the intensity of the Raman laser power was decreased until the peak positions did not show any dependence on the laser intensity. This ensured a more accurate estimation of the phonon peak locations, without laser-induced heating.

Referring to FIG. 19C, a redshift of 2.9±1.1 cm$^{-1}$ in the LO peak position is clearly evident for InAs XOI layers transferred with a 70 nm ZrO$_x$ cap as compared to those without a cap. The amount of tensile strain inside the InAs XOI layer transferred with a cap was extracted from $\Delta\omega/\omega=(K_{11}/2)e_{zz}+(K_{12}/2)(e_{xx}+e_{yy})$, where $\omega$ is the LO peak location (238.6 cm$^{-1}$), $\Delta\omega$ is the LO peak shift, $K_{11}$ (−1.753×10$^{11}$ dyn/cm$^2$), and $K_{12}$, (−2.323×10$^{11}$ dyn/cm$^2$) are the anharmonic spring constants for InAs LO phonon, and $e_{xx}=e_{yy}$, $e_{zz}=-2C_{12}/C_{11}e_{xx}$ are components of strain tensor inside InAs, with $C_1$, (8.329× 10$^{11}$ dyn/cm$^2$) and $C_{12}$ (4.526×10$^{11}$ dyn/cm$^2$) as the elastic compliance constants of InAs. From this analysis, the in-plane strain $e_{xx}=e_{y}y=0.8\pm0.3\%$, which is within the expected range of the ~0.62% initial strain of the as-grown InAs layer.

FIGS. 20A and 20B illustrate, for comparison, the lattices of relaxed InAs XOI (FIG. 20A) and strained InAs XOI (FIG. 20B) (not drawn to scale). As shown in FIGS. 20A and 20B, the lattice for the InAs transferred without the cap is more relaxed than the lattice of the InAs transferred with the cap.

In addition to preserving the initial strain of the transferred InAs layer, the ZrO$_x$ cap may also induce additional strain depending on its initial stress level upon evaporation.

To relate the amount of strain remaining in the InAs XOI layer to the ZrO$_x$ cap thickness, analytical modeling was performed. For simplicity, it was assumed that the InAs and ZrO$_x$ layers deform equally after release from the sacrificial layer and that the relationship between strain and stress is linear, given by Young's modulus E.

FIG. 21 schematically illustrates the stress distribution across a cross-section of the ZrO$_x$ cap and InAs layer. In FIG. 21, $s_{ZrOx}$ and $s_{InAs}$ are the normal stresses in ZrO$_x$ and InAs, respectively, f is the force applied to the InAs layer from the substrate to neutralize the total force, $h_{ZrOx}$ is the thickness of the ZrO$_x$ cap, and $h_{InAs}$ is the thickness of the InAs layer. The stress in each layer can be found by setting a common absolute deformation value, and the relationship between these two stresses can be set by zeroing the net moment caused by them. The remaining strain inside InAs is then determined by the following equation: $e=mn(n+2)e_0/[1+mn(n+2)]$, where $m=E_{ZrOx}/E_{InAs}\sim2.63$ is the ratio of Young's moduli of ZrO$_x$ and InAs, $n=h_{ZrOx}/h_{InAs}$ is the ratio of the thicknesses of ZrO$_x$ and InAs, $e_0=0.62\%$ is the as-grown InAs strain.

The dependence of the strain (e) in a 20 nm InAs layer on the cap thickness ($h_{ZrOx}$) is plotted in FIG. 22. The modeling indicates that the initial InAs strain is nearly fully maintained (by up to ~98%) by a 70 nm ZrO$_x$ cap, which is consistent with the experimental observations.

In accordance with certain embodiments of the invention, the strain of the X layer in XOI can be tuned by choosing different cap layers (with different Young's moduli), cap thicknesses, and the initial stress inside the cap to obtain the optimal strain level for the desired device application.

Example

InAsSb XOI Devices

InAsSb XOI devices were fabricated by growing and transferring InAs$_{0.7}$Sb$_{0.3}$ onto a Si/SiO$_2$ substrate. Dopant-free, metal contacted top- and back-gated devices were fabricated. Forming gas annealing of the gate dielectric of the top gated devices was applied to improve the high-κ quality of the dielectric and the $I_{DS}$-$V_{GS}$ characteristics (e.g., improved subthreshold swing). FIGS. 23A-23C illustrate cross-sectional views of InAsSb devices in accordance with certain embodiments of the invention. FIG. 23A shows a back-gated InAsSb XOI, FIG. 23B shows a top gated InAsSb XOI with a Ni/ZrO$_2$ gate stack, and FIG. 23C shows a back-gated InAs/InAsSb/InAs heterostructure XOI. The heterostructure XOI devices were fabricated to address the degradation of InAsSb XOI device characteristics upon high thermal annealing. The InAs capping layers (thickness, 2 nm) were added on the top and bottom surfaces of a ~8 nm thick InAsSb active layer, showing enhanced stability. Optimization of the InAs capping layers (e.g., by adjusting thickness) to achieve device characteristics similar to the single InAsSb active layer was not performed.

Example

Back-gated InAsSb XOI Device Characteristics

Back-gated devices with gate lengths ($L_G$) ranging from 150 nm to 5 μm were fabricated. A 50 nm thick SiO$_2$ was used as the back-gate dielectric. FIG. 24A shows the transfer characteristic for 7 nm and 17 nm thick InAsSb FETs. The back-gated 7 nm thick device shows an $I_{ON}/I_{OFF}$ ratio over 10$^4$. The OFF current improved as the thickness of the InAsSb active layer decreased. from 17 nm into 7 nm, which may be attributed to improved electrostatic gate control and increased bandgap due to quantum confinement of electrons. The calculated bandgap for 7 and 17 nm InAsSb XOI are ~0.35 and 0.8 eV, respectively. The effective mobilities of the back-gated InAsSb XOI FETs were extracted from $I_{DS}$-$V_{GS}$ characteristics. From the experiment embodiments, the InAs$_{0.7}$Sb$_{0.3}$ devices exhibit peak effective mobilities of ~4000 cm$^2$/V-s and ~5000 cm$^2$/V-s for 7 nm and 17 nm thickness, respectively, which are ~2× larger than the mobilities of InAs XOI FETs with similar thicknesses (see Example—Long-Channel, Back-Gated FETs Mobility Characteristics as a function of InAs thickness and FIG. 9B).

Contact resistance, $R_C$~203 O·μm (per contact) was extracted from the y-intercept of a plot of ON-state resistances vs channel length ($L_G$). In addition, systematic contact annealing studies were performed to improve the contact resistance, but indicated degradation of performance with increased annealing temperature.

Example

Top-Gated InAsSb XOI Device Characteristics

Top-gated devices with various gate lengths ($L_G$=100 nm to 6 μm) and 10 nm ZrO$_2$ (ALD) gate dielectric were fabricated. Forming gas annealing was performed to improve the gate dielectric characteristics. FIG. 24B shows the transfer characteristics for 7 nm thick top-gated InAsSb FETs at $V_{DS}$=0.05 V and 0.5 V for a gate length $L_G$ of ~500 nm. Top-gated, $L_G$=500 nm devices exhibit an $I_{ON}$ of ~0.38 mA/μm at $V_{DS}$=0.6 V. The transconductance as a function of the gate-field was also studied, and a peak $g_m$ of ~0.51 mS/μm was obtained. The intrinsic transconductance, $g_{mi}$, was extracted as $g_{mi}=g_m/(1-R_S \times g_m - R_{SD} \times g_D)$, and a peak $g_{mi}$ value of 1.1 mS/μm for $L_G$~109 nm device at VDS=0.5 V was obtained.

Accordingly, a new technology platform and device concept for the integration of ultrathin layers of III-V semiconductors directly on Si substrates is demonstrated, enabling excellent electronic device performances.

While the above examples focus on InAs as the active channel material, other compound semiconductors can be used. For example, InGaSb can be used as the active channel material to provide p-type transistor structures, as described in more detail in the example InAs/InGaSb/InAs heterostructure XOI embodiments below.

Example

InAs/InGaSb/InAs Heterostructure XOI

Figure 25A:
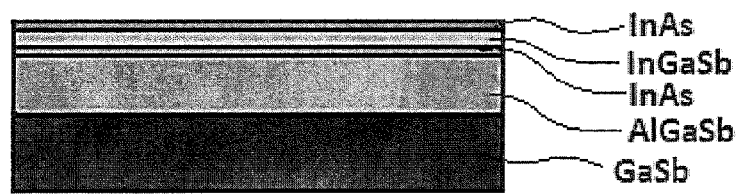
Figure 25B:
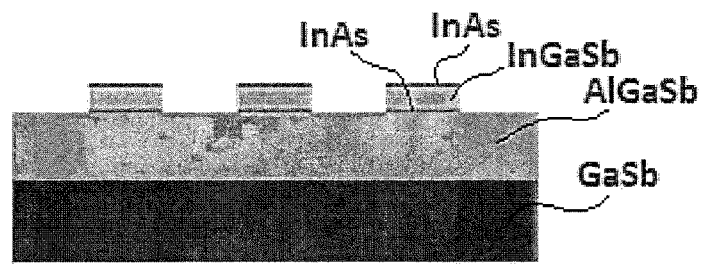
Figure 25C:
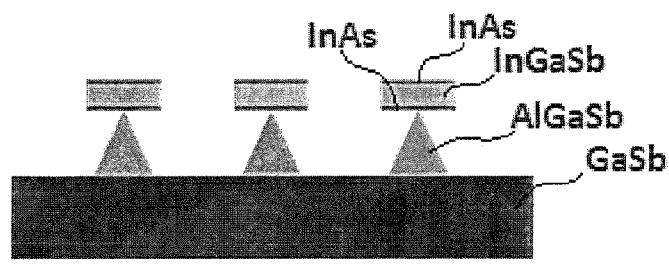
Figure 25D:
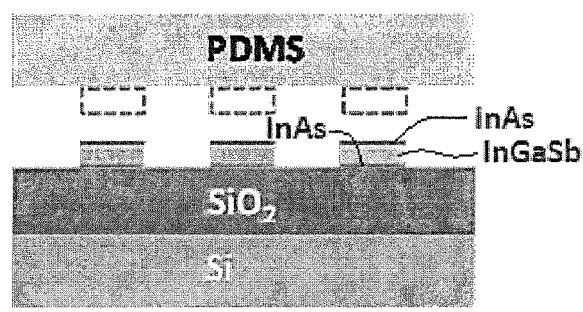

FIGS. 25A-25D illustrate a process schematic for the fabrication of InAs/InGaSb/InAs heterostructure XOI. Similar to the method described with respect to FIG. 1, epitaxial growth of semiconductor material is carried out on a source substrate. For the specific embodiment of the InAs/InGaSb/InAs heterostructure, a first InAs layer, InGaSb, and a second InAs layer are grown on a GaSb source substrate having an AlGaSb sacrificial layer as shown in FIG. 25A. Then, referring to FIG. 25B, the InAs/InGaSb/InAs layers are patterned by lithography and wet etching. Referring to FIG. 25C, a partial release of the patterned semiconductor layers is carried out by etching the sacrificial layer. Then, a PDMA slab is used to transfer the patterned semiconductor layers onto the device substrate.

Here, the InAs layers can inhibit oxidation of the InGaSb layer during the epitaxial transfer process. In addition, the thin InAs capping layers can be used to provide dopant-free, low resistance contacts for the source and drain regions.

Example

Epitaxial Layer Transfer of InGaSb for III-V p-FET on Si

For the InGaSb experiments, InGaSb XOI substrates were fabricated. In particular, Al0.2Ga0.8Sb (thickness, 60 nm), InAs (thickness, 3 nm), 1n0.3Ga0.7Sb (thickness, 7-15 nm) and InAs (thickness, 3 nm) layers were epitaxially grown on a (100) GaSb wafer by molecular beam epitaxy (MBE). In this stack, AlGaSb is the sacrificial layer and the InAs layers are the surface cladding caps for the InGaSb channel material. The InAs/InGaSb/InAs layers were patterned into nanoribbon (NR) structures by lithography and wet etching similar to the process described in the Example Patterning of Semiconductors on Source Substrate; however, a ratio of PMMA and standard optical resist (70:30 volume ratio) was used instead of only the PMMA. In addition, for the InGaSb layer, a hydrochloric acid (3.7% in DI $H_2O$) and hydrogen peroxide (30%) mixture at a volume ratio of (200:1) was used (etch rate, ~1 nm/sec).

Partial release of the NRs was carried out similarly to that described in the Example Sacrificial Layer Etch, and the stamp transfer process followed as described in the Example Stamp Transfer Process. A 10 sec HF (1:50 in DI $H_2O$) treatment was performed on the PDMS having the NRs to ensure a high quality interface between InAs and $SiO_2$ by removing any residual AlGaSb from the back surface of the NRs. Then, the layers were transferred onto a Si/$SiO_2$ substrate by the direct contact of PDMS onto the receiver substrate, and the PMMA/standard optical resist layer was stripped in acetone.

Atomic force microscopy (AFM) images of the resulting NRs having a width of ~350 nm and a height of ~15 nm ($T_{InGaSb}$=10 nm) on a Si/$SiO_2$ substrate are shown in FIGS. 26A and 26B, clearly depicting that uniform layer transfer can be achieved with minimal surface roughness.

The atomic structure of the interfaces for the example InGaSb XOI device can be seen in the cross-sectional TEM image shown in FIG. 27, which shows the high quality of the single crystalline InAs/InGaSb/InAs XOI layers ($T_{InGaSb}$=15 nm). As shown, the InAs layers were slightly reduced in thickness (by ~0.5 nm) during the XOI transfer process, which is attributed to removal of a thin native oxide layer during the XOI processing steps.

Example

Back-Gated pFET Energy Band Diagram Characteristics

The energy band diagram of the InAs/InGaSb/InAs XOI heterostructure was calculated using device simulations of a long channel, back-gated FET device structure with Ni source/drain contacts and a $ZrO_2$ capping layer. FIGS. 28A and 28B show energy band diagrams of the region under the source/drain metal contacts (FIG. 28A) and the channel region (FIG. 28B).

Referring to FIG. 28A, the energy band diagram is directed to the region under the source/drain (S/D) metal (Ni) contacts where the conduction band of InAs is assumed to be ohmically contacted to the metal. Here, the electrons in the ultrathin InAs cap are not confined due to the ohmic contact to the metal with the ground state being close to the conduction band edge of bulk InAs. Holes in InGaSb are partially confined to 2D sub-bands, the magnitude of which depends on the thickness of InGaSb. The InAs/InGaSb interface under the metal contact was found to exhibit a broken gap (i.e., type III) band alignment for the explored InGaSb thickness range (7-15 nm) with the ground state of electrons in InAs being below the ground state of holes in InGaSb. This "broken gap" band structure results in a semi-metallic behavior, thereby, allowing for dopant-free contact to the valence band of InGaSb with relatively low resistances. Referring to FIG. 28B, the energy band diagram is directed to the channel region of the device. Here, InAs cap layers are in contact with large band gap dielectrics ($ZrO_2$ on the top and $SiO_2$ on the bottom surfaces) which effectively serve as potential barriers for electrons. As a result, the 2.5 nm InAs cap is highly confined. In this case, the InAs/InGaSb exhibits a staggered gap band alignment (i.e., type II), with the ground state of electrons in InAs being above that of the holes in InGaSb. As a result, in this case, the material stack behaves like a conventional quantum-well device, especially for holes which are highly confined in the InGaSb channel. This results in a high mobility 2-D hole gas, where the carriers are separated from the surface by the thickness of the InAs cap.

Example

Back-Gated p-FET Device Structure (see FIG. 29)

Back-gated p-FETs were fabricated by patterning Ni (thickness, 40 nm) source (S) and drain (D) contacts. The heavily doped Si substrate was used as the global back-gate with a 50 nm thermally grown $SiO_2$ as the back-gate dielectric. The devices were then capped with ~8 nm $ZrO_2$ by atomic layer deposition (ALD) in order to isolate them from the ambient environment (i.e., humidity and other contaminants).

Example

Top-Gated p-FET Device Structure (see FIG. 30)

In order to explore the performance limits of InAs/InGaSb/InAs XOI FETs, top-gated devices were fabricated after transferring the InAs/InGaSb/InAs heterostructure onto a Si/SiO$_2$ substrate by depositing 10 nm ZrO$_2$ (by ALD) as the gate dielectric followed by a forming gas anneal (5% H$_2$ in Ar) at 130° C. for 30 min, and patterning of the top gate electrodes using photolithography, metal deposition (Ni, 50 nm), and lift-off. The forming gas anneal was used to improve the InAs/high-κ interface quality, and resulted in a lower subthreshold swing Here, the top-gate overlaps the S/D and the channel length is ~2.5 int.

Example

Back-Gated p-FET Electrical Properties

Figure 31A:
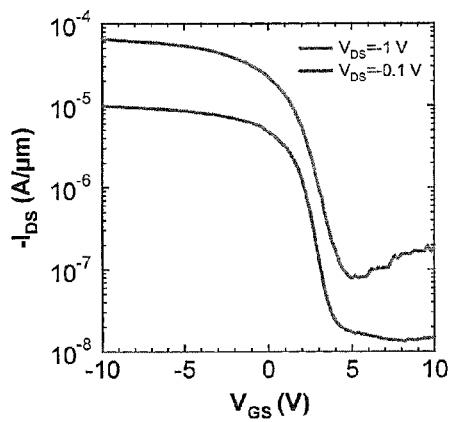

FIG. 31A shows representative transfer characteristics of a back-gated InAs/InGaSb/InAs XOI p-FET as described with respect to FIG. 29, with an active channel thickness of $T_{InGaSb}$=15 nm.

A long-channel transistor length of L~3 µm is used for enabling extraction of the carrier mobility. According to the experiments, the device exhibited an $I_{ON}/I_{OFF}$~10$^3$. The effective hole mobility, µp, of the device was then extracted as a function of the vertical field (i.e., gate voltage) by using $$\mu_p = g_D \times \frac{L}{W} \times \frac{1}{C_{ox}(V_{GS} - V_{th})},$$

where $$g_D = \frac{dI_{DS}}{dV_{DS}}\bigg|_{V_{GS}},$$

$C_{ox}$, is the gate oxide capacitance, W is the channel width, and $V_{th}$ is the threshold voltage.

Figure 31B:
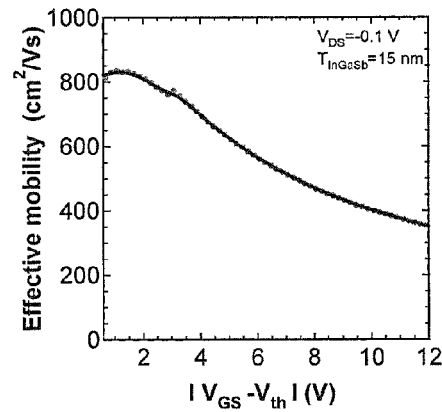

Referring to FIG. 31B, the experimental device shows a peak effective mobility of ~820 cm$^2$/Vs at $V_{DS}$=-0.1V.

Figure 31C:
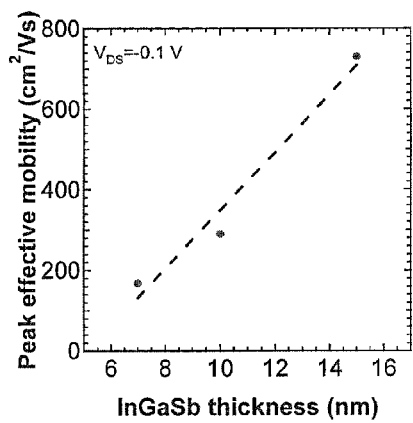

The effect of $T_{InGaSb}$ on the electrical properties of the p-FETs was examined by keeping all other parameters constant. As shown in FIG. 31C, the peak effective mobility decreases with the decrease of InGaSb thickness, which may be attributed to the enhanced surface scattering rates for thinner layers where most of the transport takes place closer to the surface.

Figure 31D:
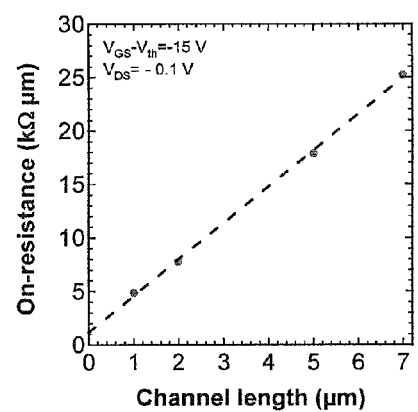
Figure 31E:
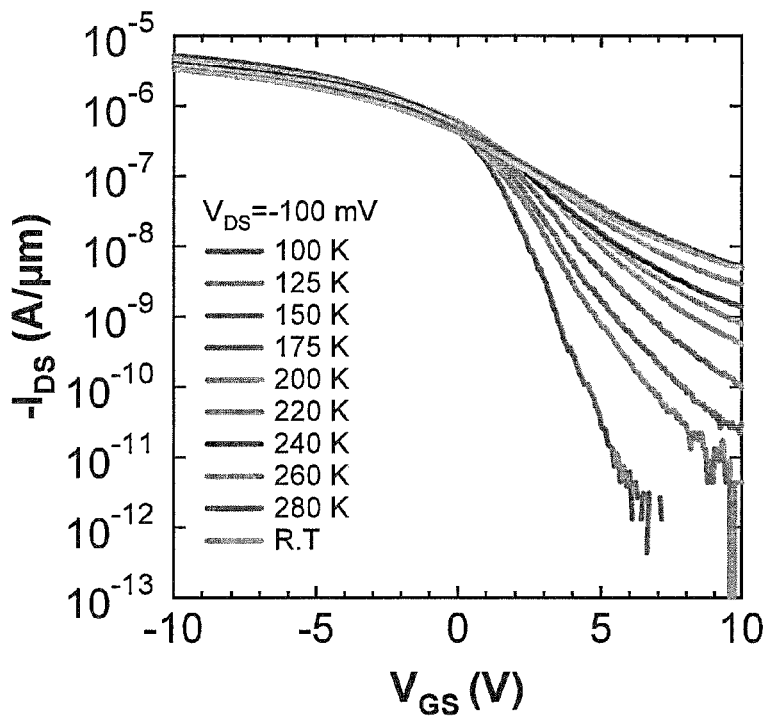

The contact resistance of the back-gated p-FET devices was also characterized using a transfer length method (TLM). Back-gated p-FETs with channel lengths of L=1-7 µm (measured by scanning electron microscopy) were fabricated and the ON-resistance at a vertical field of $V_{GS}$-$V_{th}$=-15 V was extracted and plotted as shown in FIG. 31D. As shown in FIG. 31E, the y-intercept of the ON-resistance versus L is approximately equal to 2Rc, where Rc is the resistance associated with each contact (i.e., S or D). A contact resistance of ~580 O µm was extracted for the device having the undoped InAs and InGaSb layers.

FIG. 31E shows the temperature dependence of the $I_{DS}$-$V_{GS}$ characteristics for a back-gated InAs/InGaSb/InAs XOI FET with $T_{InGaSb}$=7 nm. As the temperature is lowered from room temperature to 100 K, $I_{OFF}$ decreases by >3 orders of magnitude.

Figure 31F:
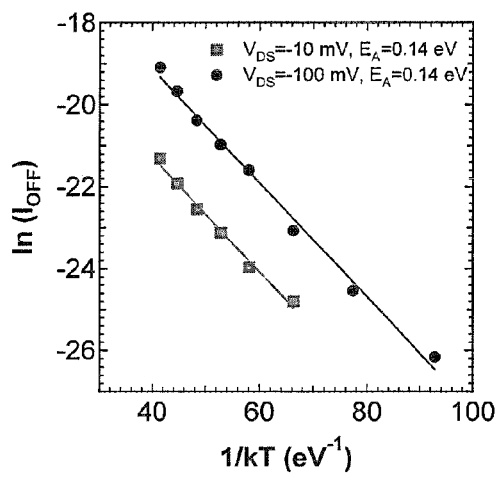

FIG. 31F shows an Arrhenius plot of $I_{OFF}$ (the OFF-state current as a function of 1/kT) using the minimum current shown in FIG. 31E. An activation energy (EA) of ~0.14 eV is extracted, which is lower than half of the bandgap for InGaSb or InAs. Based on the extracted results it appears that performance of InAs capped InGaSb XOI may be improved by optimizing the growth of the layers.

Figure 31G:
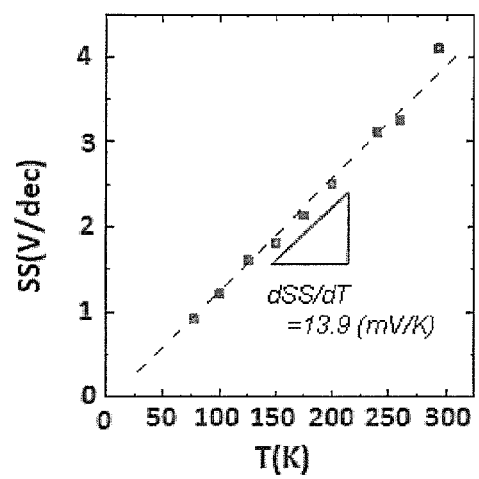

Referring to FIG. 31G, to estimate the density of interface state traps ($D_{it}$), the change of the subthreshold swing (SS) with temperature was fitted with the analytical equation, $$\frac{dSS}{dT} = \frac{2.3k}{q}\left(1 + \frac{C_{it}}{C_{ox1}} + \frac{C_{InGaSb}}{C_{ox1}} - \frac{\frac{C_{InGaSb}^2}{C_{ox1}C_{ox2}}}{1 + \frac{C_{it}}{C_{ox2}} + \frac{C_{InGaSb}}{C_{ox2}}}\right)$$

where k is Boltzmann constant, q is the electron charge, $C_{it}$=q$^2$D$_{it}$ is the interface trap capacitance, and $C_{InGaSb}$=e$_{InGaSb}$/T$_{InGaSb}$ is the InGaSb body capacitance, e$_{InGaSb}$=16 is the dielectric constant of InGaSb, and $C_{ox1}$ and $C_{ox2}$ are the capacitances of the active and non-active gates, respectively. To model the back gated devices, the equation was evaluated in the limit of $C_{ox2}$→0 and $C_{ox1}$ being the back-gate oxide capacitance. The model assumes the carriers are directly beneath the gate, ignoring the finite distance from the surface due to quantization effects. Furthermore, the effect of the quantum capacitance ($C_Q$) is not considered since, $C_Q$>>$C_{ox}$. The effect of body leakage was also ignored. The rough estimate for the $D_{it}$ of the device was determined to be ~2×10$^{13}$ cm$^{-2}$ eV$^{-1}$.

Example

Top-Gated p-FET Electrical Properties

FIGS. 32A and 32B show the representative electrical characteristics of a top-gated p-FET fabricated as described with respect to FIG. 30, with $T_{InGaSb}$=7 nm. This long-channel (L$_G$~2.5 µm) device displays $I_{ON}/I_{OFF}$=10$^3$-10$^4$ with ON-state current density of ~60 µA/µm as normalized by the channel width at $V_{DD}$=$V_{GS}$=$V_{DS}$=-0.9 V. The subthreshold swing is SS~146 mV/decade with a peak transconductance, g$_m$, of ~48 µS/µm at V$_D$S=-0.5 V.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

What is claimed is:

1. A method of fabricating a high performance semiconductor device, the method comprising:
   growing a single-crystalline semiconductor material on a source substrate, wherein the source substrate comprises a base material and a sacrificial layer on the base material;
   patterning the semiconductor material; and
   transferring the patterned semiconductor material onto a dielectric layer of a device substrate,
   wherein the transferring of the patterned semiconductor material comprises bonding the source substrate having the patterned semiconductor material to the target substrate, and removing the source substrate to leave the patterned semiconductor material on the target substrate.

2. The method according to claim 1, wherein the base material comprises GaSb, wherein the sacrificial layer comprises $Al_wGa_{1-w}Sb$, wherein the growing of the single-crystalline semiconductor material on the source substrate comprises growing $InAs_xSb_{1-x}$ on the sacrificial layer.

3. The method according to claim 1, wherein the base material comprises GaSb, wherein the sacrificial layer comprises $Al_wGa_{1-w}Sb$, wherein the growing of the single-crystalline semiconductor material on the source substrate comprises growing a first InAs layer on the sacrificial layer, growing $In_xGa_{1-x}Sb$ on the first InAs layer, and growing a second InAs layer on the $In_xGa_{1-x}Sb$ to form a single crystalline InAs/InGaSb/InAs heterostructure on the sacrificial layer.

4. A method of fabricating a high performance semiconductor device, the method comprising:
   growing a single-crystalline semiconductor material on a source substrate, wherein the source substrate comprises a base material and a sacrificial layer on the base material;
   patterning the semiconductor material;
   transferring the patterned semiconductor material onto a dielectric layer of a device substrate; and
   etching the sacrificial layer of the source substrate after patterning the semiconductor material,
   wherein the transferring of the patterned semiconductor material comprises using a stamp, wherein a contacting surface of the stamp is inorganic.

5. The method according to claim 1, wherein the removing of the source substrate comprises:
   etching the sacrificial layer after bonding the source substrate to the target substrate.

6. The method according to claim 1, wherein the patterning of the semiconductor material comprises etching the semiconductor material using an etch mask to form nanoribbons of the semiconductor material.

7. The method according to claim 1, further comprising forming a thermal oxide on the patterned semiconductor material before transferring the patterned semiconductor material.

8. The method according to claim 1, further comprising forming a capping layer on the semiconductor material before patterning the semiconductor material, the capping layer having a material and thickness for inhibiting a relaxation of strain in the semiconductor material.

9. The method according to claim 8, wherein the capping layer comprises zirconium oxide or silicon oxide.

10. The method according to claim 1, further comprising performing each of the growing of single-crystalline semiconductor material, patterning of the semiconductor material, and transferring of the patterned semiconductor material multiple times to achieve multiple patterned crystalline semiconductor layers on the device substrate.

11. The method according to claim 1, wherein the single crystalline semiconductor material is a II-IV or III-V compound semiconductor.

12. The method according to claim 1, wherein the device substrate comprises a silicon substrate, the dielectric layer being an oxide layer on the silicon substrate.

13. A semiconductor on insulator device fabricated according to the method of claim 1, the patterned semiconductor material on the device substrate providing an active area of the device.

14. A semiconductor on insulator device comprising:
   a II-IV or III-V single crystalline semiconductor layer on a dielectric layer on a silicon substrate, the semiconductor layer providing an active area of the device, wherein the device substrate comprises a bulk substrate having CMOS structures thereon, the dielectric layer being an interlayer dielectric on the CMOS structures.

15. A semiconductor on insulator device comprising:
   a II-IV or III-V single crystalline semiconductor layer on a dielectric layer on a silicon substrate, the semiconductor layer providing an active area of the device, wherein the semiconductor layer comprises $InAs_xSb_{1-x}$ and the device is an n-type field effect transistor.

16. A semiconductor on insulator device comprising:
   a II-IV or III-V single crystalline semiconductor layer on a dielectric layer on a silicon substrate, the semiconductor layer providing an active area of the device, wherein the semiconductor layer comprises $In_xGa_{1-x}Sb$ and the device is a p-type field effect transistor.

17. The method according to claim 4, wherein the base material comprises GaSb, wherein the sacrificial layer comprises $Al_wGa_{1-w}Sb$, wherein the growing of the single-crystalline semiconductor material on the source substrate comprises growing $InAs_xSb_{1-x}$ on the sacrificial layer.

18. The method according to claim 4, wherein the base material comprises GaSb, wherein the sacrificial layer comprises $Al_wGa_{1-w}Sb$, wherein the growing of the single-crystalline semiconductor material on the source substrate comprises growing a first InAs layer on the sacrificial layer, growing $In_xGa_{1-x}Sb$ on the first InAs layer, and growing a second InAs layer on the $In_xGa_{1-x}Sb$ to form a single crystalline InAs/InGaSb/InAs heterostructure on the sacrificial layer.

19. The method according to claim 4, wherein the patterning of the semiconductor material comprises etching the semiconductor material using an etch mask to form nanoribbons of the semiconductor material.

20. The method according to claim 4, further comprising forming a thermal oxide on the patterned semiconductor material before transferring the patterned semiconductor material.

21. The method according to claim 4, further comprising forming a capping layer on the semiconductor material before patterning the semiconductor material, the capping layer having a material and thickness for inhibiting a relaxation of strain in the semiconductor material.

22. The method according to claim 21, wherein the capping layer comprises zirconium oxide or silicon oxide.

23. The method according to claim 4, further comprising performing each of the growing of single-crystalline semiconductor material, patterning of the semiconductor material, and transferring of the patterned semiconductor material multiple times to achieve multiple patterned crystalline semiconductor layers on the device substrate.

24. The method according to claim 4, wherein the single crystalline semiconductor material is a II-IV or III-V compound semiconductor.

25. The method according to claim 4, wherein the device substrate comprises a silicon substrate, the dielectric layer being an oxide layer on the silicon substrate.

26. A semiconductor on insulator device fabricated according to the method of claim 4, the patterned semiconductor material on the device substrate providing an active area of the device.

* * * * *

UNITED STATES PATENT AND TRADEMARK OFFICE
CERTIFICATE OF CORRECTION

PATENT NO. : 8,525,228 B2
APPLICATION NO. : 13/175281
DATED : September 3, 2013
INVENTOR(S) : Javey et al.

Page 1 of 1

It is certified that error appears in the above-identified patent and that said Letters Patent is hereby corrected as shown below:

In the Specification

Column 2,
Lines 51-52, "form in p-FETs" should read --form p-FETs--.

Column 9,
Line 13, "to fowl high performance" should read --to form high performance--.

Column 11,
Lines 40-41, "set to 0.35 mL/s for Ga, 0.30 mL/s for In and 0.43 mL/s for AlGaSb."
should read --set to 0.35 ML/s for Ga, 0.30 ML/s for In and 0.43 ML/s for AlGaSb.--.

Column 20,
Line 27, "high-x" should read --high-κ--.

Column 23,
Line 16, "with $C_1$," should read --with $C_{11}$--.

Column 24,
Line 27, "$I_{ON}/T_{OFF}$" should read --$I_{ON}/I_{OFF}$--.

Column 27,
Line 14, "InAs/high-x" should read --InAs/high-κ--.
Line 16, "~2.5 int." should read --~2.5 μm.--.
Line 25, "$T_{InGasb}$=15 nm." should read --$T_{InGaSb}$=15 nm.--.
Line 44, "$C_{ox,}$ is" should read --$C_{ox}$ is--.

Signed and Sealed this
Third Day of June, 2014

Michelle K. Lee
*Deputy Director of the United States Patent and Trademark Office*